(12) United States Patent
Kitamori et al.

(10) Patent No.: US 9,888,192 B2
(45) Date of Patent: Feb. 6, 2018

(54) IMAGING DEVICE

(71) Applicant: Renesas Electronics Corporation, Tokyo (JP)

(72) Inventors: Tatsuya Kitamori, Tokyo (JP); Fumihide Murao, Tokyo (JP); Kyoji Yamasaki, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/378,223

(22) Filed: Dec. 14, 2016

(65) Prior Publication Data

US 2017/0187969 A1 Jun. 29, 2017

(30) Foreign Application Priority Data

Dec. 28, 2015 (JP) ................................. 2015-256249

(51) Int. Cl.
| | |
|---|---|
| *H04N 5/369* | (2011.01) |
| *H04N 5/3745* | (2011.01) |
| *H04N 5/376* | (2011.01) |
| *H01L 27/146* | (2006.01) |
| *H04N 5/357* | (2011.01) |
| *H04N 5/378* | (2011.01) |
| *H04N 5/347* | (2011.01) |

(52) U.S. Cl.
CPC ....... *H04N 5/357* (2013.01); *H01L 27/14605* (2013.01); *H01L 27/14621* (2013.01); *H01L 27/14627* (2013.01); *H01L 27/14636* (2013.01); *H01L 27/14645* (2013.01); *H04N 5/347* (2013.01); *H04N 5/3696* (2013.01); *H04N 5/378* (2013.01); *H04N 5/3765* (2013.01); *H04N 5/37457* (2013.01)

(58) Field of Classification Search
None
See application file for complete search history.

(56) References Cited

U.S. PATENT DOCUMENTS 9,124,836 B2 * 9/2015 Shim ..................... H04N 5/2355
2014/0333814 A1 * 11/2014 Tashiro ............. H01L 27/14621
348/308

FOREIGN PATENT DOCUMENTS

| EP | 1 085 751 B1 | 11/2012 |
|---|---|---|
| JP | 3774597 B2 | 5/2006 |

\* cited by examiner

*Primary Examiner* — Mark T Monk
(74) *Attorney, Agent, or Firm* — Sughrue Mion, PLLC

(57) ABSTRACT

A related art imaging device is accompanied by the problem that it must perform read processing on pixel data generated within pixel units for every row, and an SN ratio of the pixel data is not capable of being enhanced sufficiently. According to one embodiment, an imaging device has common floating diffusion wirings and floating diffusion switches which switch whether or not to couple floating diffusions of a plurality of pixel units arranged in a column direction, and combines pixel data generated by the pixel units in the floating diffusions coupled within the pixel units.

15 Claims, 25 Drawing Sheets

FIG. 10
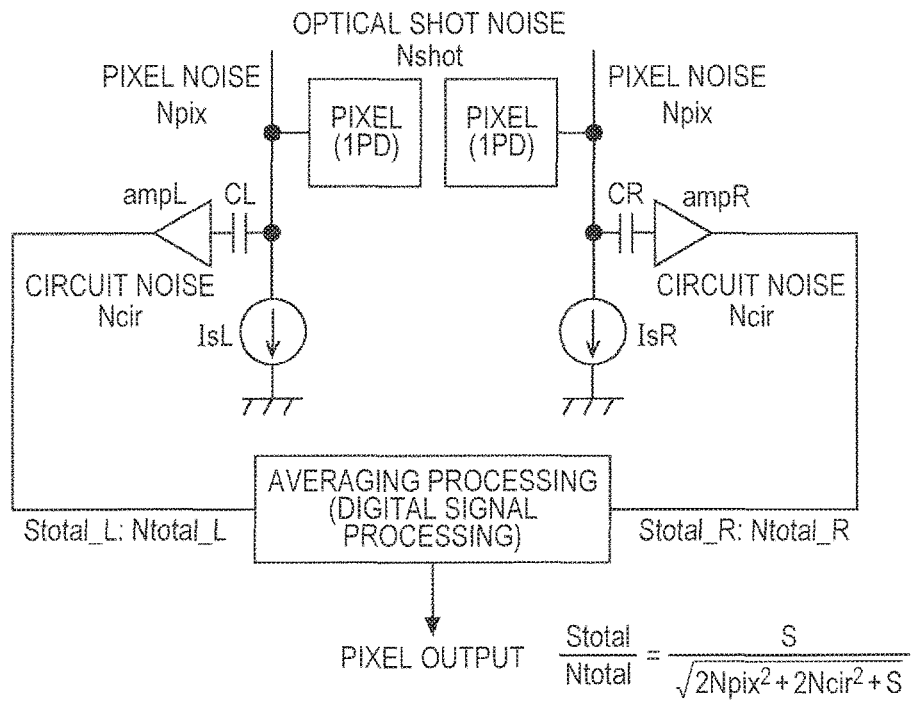
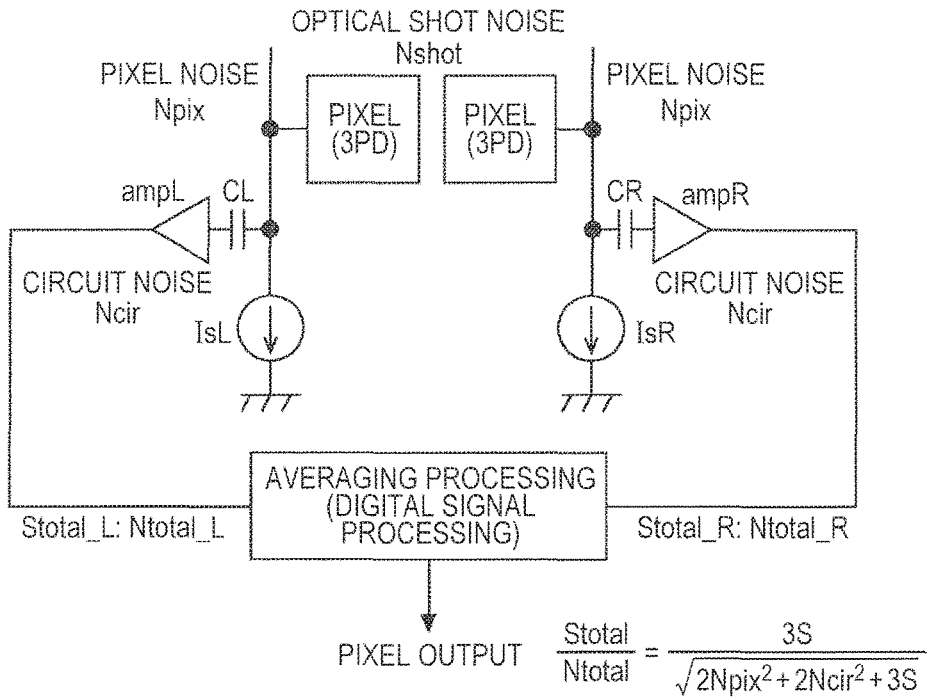

FIG. 23
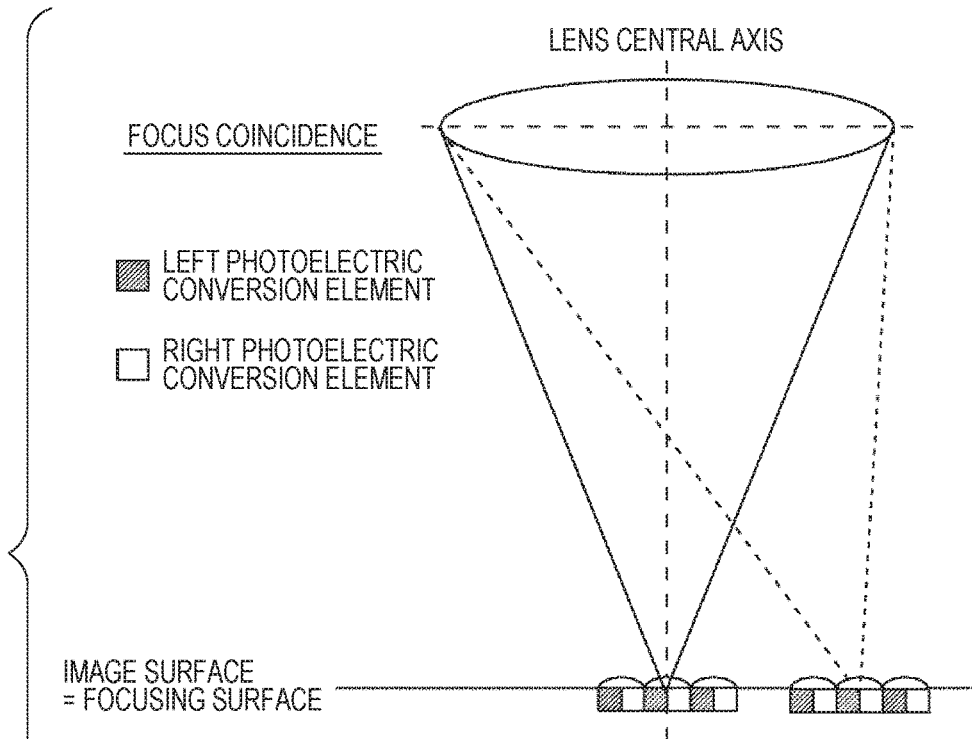
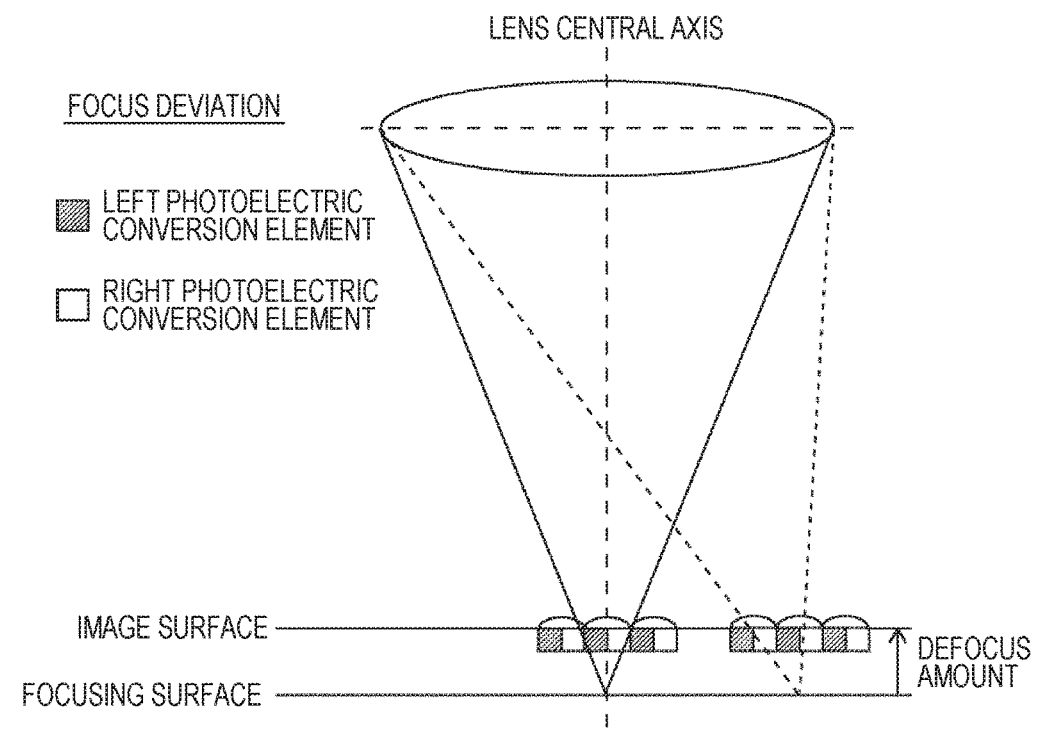

FIG. 25
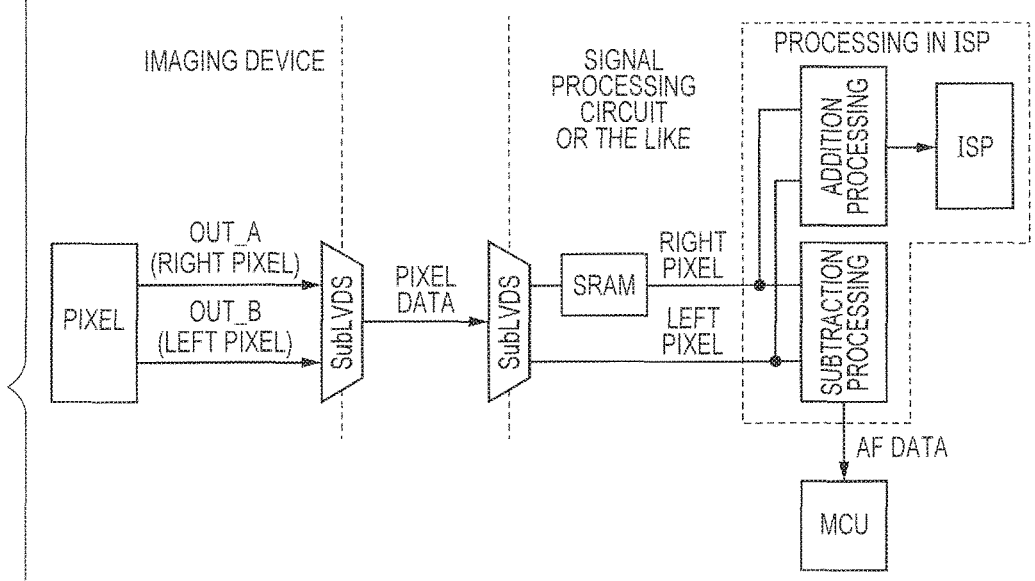
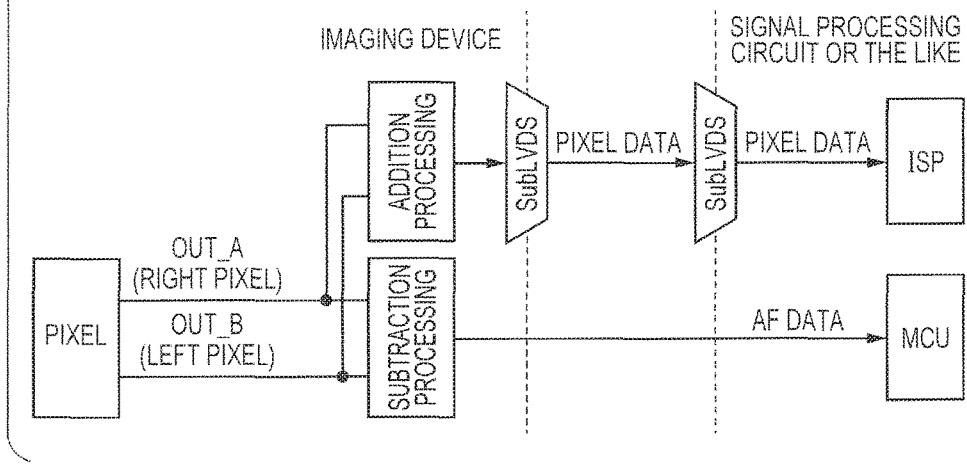

IMAGING DEVICE

CROSS-REFERENCE TO RELATED APPLICATIONS

The disclosure of Japanese Patent Application No. 2015-256249 filed on Dec. 28, 2015 including the specification, drawings and abstract s incorporated herein by reference in its entirety.

BACKGROUND

The present invention relates to an imaging device, and, for example, to an imaging device having pixel units arranged in a lattice form.

In an imaging apparatus such as a camera or the like, a CCD or a CMOS sensor is used as an imaging device, and an image acquired by the imaging device is outputted as imaged data. This imaging apparatus is often equipped with an autofocus function of automatically enhancing the sharpness of an image to be photographed. There is known a phase difference system as a system for realizing the autofocus function.

In the phase difference system, a pair or two pairs of light receiving units are provided for each microlens arranged two-dimensionally, and the light receiving units are projected onto the pupil of an imaging optical system by the microlenses to thereby split the pupil. Then, in the phase difference system, object images are respectively formed using two luminous fluxes passed through portions different in terms of the pupil of the imaging optical system. A positional phase difference between the two object images is detected based on the output of the imaging device and converted into a defocus amount of the imaging optical system. An example of such an imaging apparatus having the autofocus function of the phase difference system has been disclosed in Patent Document 1.

RELATED ART DOCUMENTS

Patent Document

[Patent Document 1] Japanese Patent No. 3774597 Specification

SUMMARY

The imaging apparatus described in Patent Document 1 is however accompanied by the problem that the reading of pixel data can be carried out only in units of the pair of light receiving units, and an SN ratio (Signal Noise Ratio) of the pixel data cannot be enhanced sufficiently. Other objects and novel features will become apparent from the description of the present specification and the accompanying drawings.

According to one aspect of the present invention, an imaging device is provided which has common floating diffusion wirings and floating diffusion switches adapted to switch whether or not to couple floating diffusions of a plurality of pixel units arranged in a column direction, and combines pixel data generated by the pixel units in the floating diffusions coupled within the pixel units.

According to the one aspect of the present invention, pixel data generated by a plural of pixel units are combined within the pixel units to thereby make it possible to enhance an SN ratio of the pixel data.

BRIEF DESCRIPTION OF THE DRAWINGS

FIG. 10 is a diagram describing an SN ratio in the imaging device according to the embodiment 1;

FIG. 23 is a diagram describing the principle of a phase difference autofocus in an imaging device;

FIG. 25 is a diagram describing a configuration example of a camera system according to an embodiment 9.

DETAILED DESCRIPTION

Embodiment 1

Figure 1:
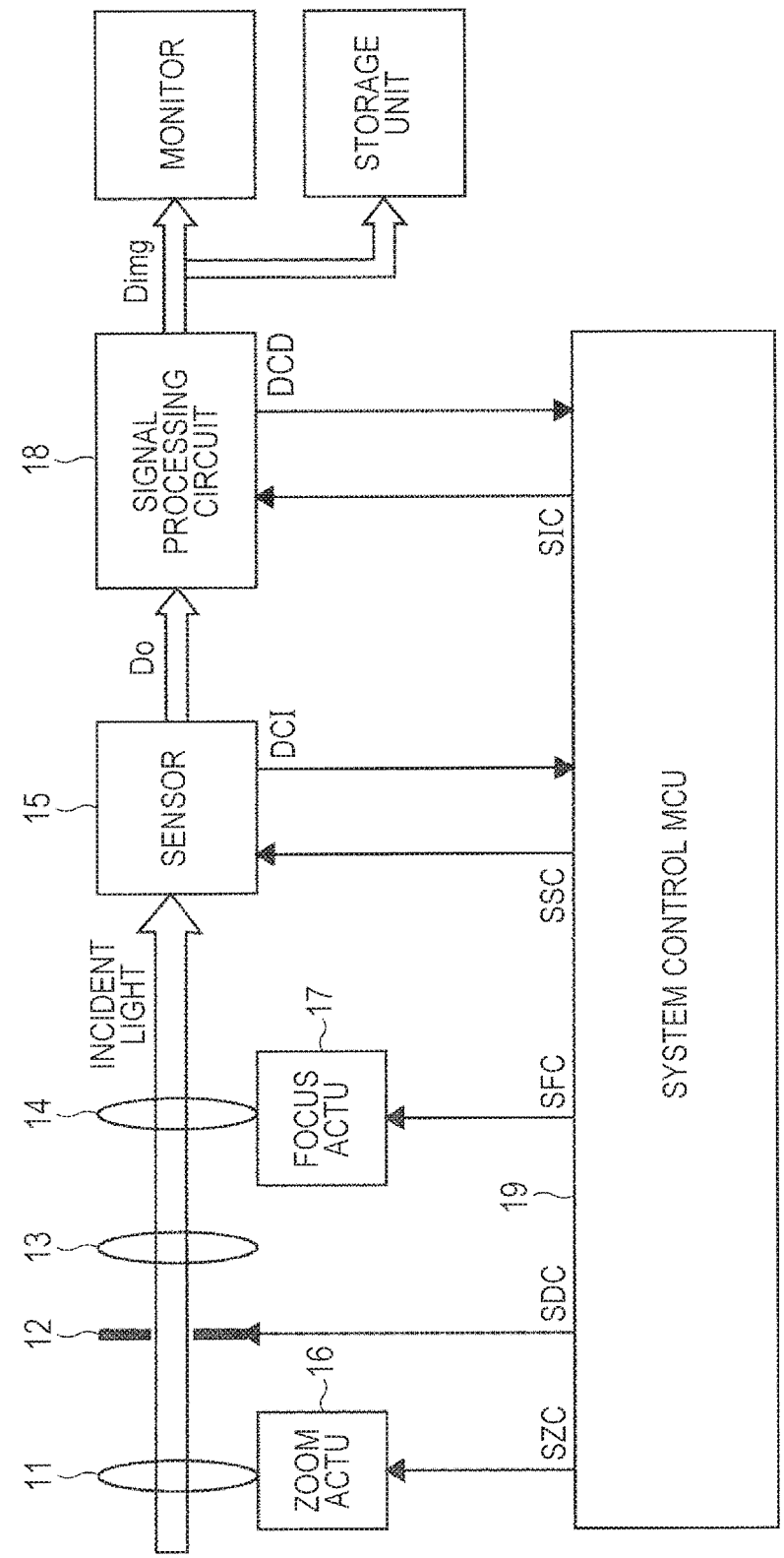
FIG. 1 is a block diagram of a camera system including an imaging device according to an embodiment 1.

For the sake of clarity of description, the following description and drawings are omitted and simplified as appropriate. Further, respective elements described in the drawings as functional blocks which perform various processing can be comprised of a CPU, a memory and other circuits on a hardware basis. They are implemented by a program or the like loaded in a memory on a software basis. According it is understood by a person of ordinary skill in the art that these functional blocks can be realized in various forms by only hardware, only software, or their combination. They are not limited to any of them. Incidentally, in the respective drawings, the same reference numerals are attached to the same elements, and their dual description will be omitted as needed.

Further, the above-described program can be stored by using various types of non-transitory computer readable mediums and supplied to a computer. The non-transitory computer readable mediums include various types of tangible storage mediums. Examples of the non-transitory computer readable mediums include a magnetic recording medium (e.g., flexible disk, magnetic tape, hard disk drive), a magneto-optical recording medium (e.g., magneto-optical disk), a CD-ROM (Read Only Memory) CD-R, a CD-R/W, a semiconductor memory (e.g., mask ROM, PROM (Programmable ROM) EPROM (Erasable PROM), a flash ROM, a RAM (Random Access Memory)). Further, the program may be supplied to the computer by various types of transitory computer readable mediums. Examples of the transitory computer readable mediums include an electrical signal, an optical signal, and an electromagnetic wave. The transitory computer readable mediums are capable of supplying the program to the computer through wired communication paths such as an electric wire, an optical fiber, etc., or a wireless communication path.

<Description of Cameral System>

A block diagram of a camera system 1 according to the embodiment 1 is shown in FIG. 1. As shown in FIG. 1, the camera system 1 has a zoom lens 11, a diaphragm mechanism 12, a fixed lens 13, a focus lens 14, an imaging device 15, a zoom lens actuator 16, a focus lens actuator 17, a signal processing circuit 18, a system control MCU 19, a monitor, and a memory unit. Here, the monitor and the memory unit are adapted to confirm and store an image photographed by the camera system 1. These may be provided on another system separated from the cameral system 1.

The zoom lens 11, the diaphragm mechanism 12, the fixed the focus lens 14 configure a lens group of the lens 13, and cameral system 1. The zoom lens 11 is changed in position by the zoom actuator 16. The focus lens 14 is changed in position by the focus actuator 17. Further, in the cameral system 1, the zoom magnification and the focus are changed by moving the lenses by the various actuators, and the amount of incident light is changed by operating the diaphragm mechanism 12.

The zoom actuator 16 moves the zoom lens 11, based on a zoom control signal SZC outputted by the system control MCU 19. The focus actuator 17 moves the focus lens 14, based on a focus control signal SFC outputted by the system control MCU 19. The diaphragm mechanism 12 adjusts a diaphragm amount according to a diaphragm control signal SDC outputted by the system control MCU 19.

The imaging device 15 has, for example, a light receiving element such as a photodiode or the like, and converts light-receiving pixel information obtained from the light receiving element into a digital value and outputs image data Do therefrom. Further, the imaging device 15 analyzes the image data Do outputted by the imaging device 15 and outputs image characteristic information DCI indicative of the characteristic of the image data Do. The image characteristic information DCI includes two images acquired upon autofocus processing to be described later. Further, the imaging device 15 performs gain control for each pixel of the image data Do, exposure control of the image data Do, and HDR (High Dynamic Range) control of the image data Do, based on a sensor control signal SSC given from the system control MCU 19. Details of the imaging device 15 will be described later.

The signal processing circuit 18 performs image processing such as an image correction or the like on the image data Do received from the imaging device 15 and outputs image data Dimg. The signal processing circuit 18 analyzes the received image data Do and outputs color space data DCD. The color space data DCD includes, for example, brightness data of the image data Do, and color data.

The system control MCU 19 controls the focus of the lens group, based on the image characteristic information DCI outputted from the imaging device 15. More specifically, the system control MCU 19 outputs the focus control signal SFC to the focus actuator 17 to control the focus of the lens group The system control MCU 19 outputs the diaphragm control signal SDC to the diaphragm mechanism 12 to adjust the diaphragm amount of the diaphragm mechanism 12. Further, the system control MCU 19 generates the zoom control signal SZC according to a zoom instruction given from outside and outputs the zoom control signal SZC to the zoom actuator 16 to control the zoom magnification of the lens group.

More specifically, the focus is deviated by moving the zoom lens 11 by the zoom actuator 16. Therefore, the system control MCU 19 calculates a positional phase difference between two objects, based on two images included in the image characteristic information DCI obtained from the imaging device 15 and calculates a defocus amount of the lens group, based on the positional phase difference. The system control MCU 19 automatically obtains focusing according to the defocus amount. This processing is auto focus control.

Also, the system control MCU 19 calculates an exposure control value instructing exposure settings of the imaging device 15, based on the brightness data included in the color space information DCD outputted by the signal processing circuit 18 and controls light-exposure settings and gain settings of the imaging device 15 in such a manner that the brightness data included in the color space information DCD outputted from the signal processing circuit 18 approaches the exposure control value. At this time, the system control MCU 19 may calculate a control value for the diaphragm mechanism 12 when changing the exposure.

Further, the system control MCU 19 outputs a color space control signal SIC adapted to adjust the brightness or color of the image data Dimg, based on instructions given from a user. Incidentally, the system control MCU 19 generates the color space control signal SIC, based on the difference between the color space information DCD acquired from the signal processing circuit 18 and the data given from the user.

The camera system 1 according to the embodiment 1 has one feature in terms of a control method of the imaging device 15 when the imaging device 15 acquires the image data Do upon the autofocus processing. The imaging device 15 will therefore be described in detail below.

<Description Related to Operation of Imaging Device>

Figure 2:
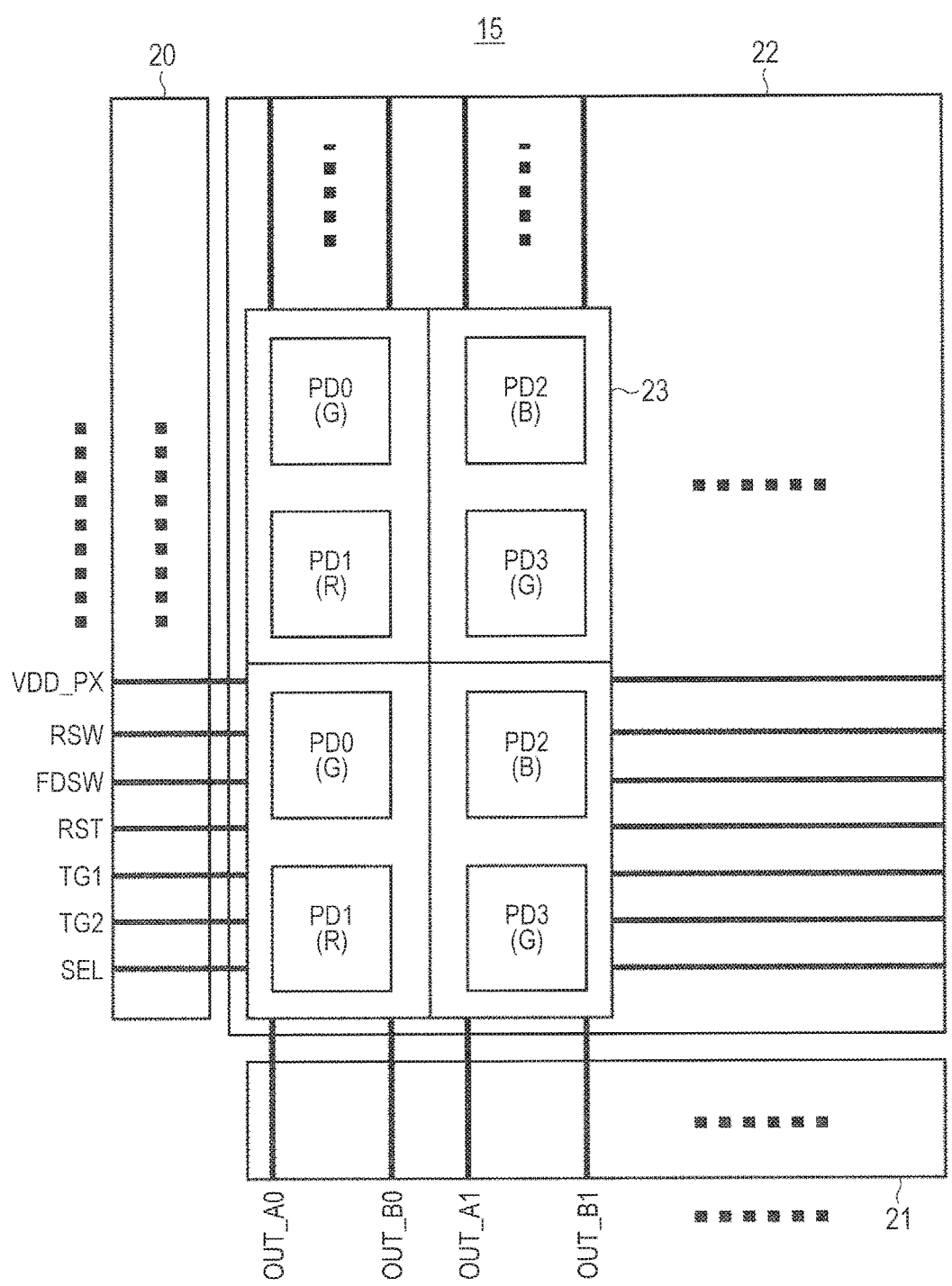
FIG. 2 is a schematic diagram of a floor layout of the imaging device according to the embodiment 1.

A schematic diagram of a part of a floor layout of the imaging device according to the embodiment 1 is shown in FIG. 2. In FIG. 2, of the floor layout Of the imaging device 15, only the floor layouts of a row controller 20, a column controller 21, and a pixel array 22 are shown.

The row controller 20 controls for each row, an active state of each pixel unit 23 arranged in a lattice form. The column controller 21 reads for every column, pixel signals read from the pixel units 23 arranged in the lattice form. The column controller 21 includes a switch circuit and an output buffer for reading the pixel signals. The pixel units 23 are arranged in the pixel array 22 in the lattice form. In the example shown in FIG. 2, each pixel unit 23 includes a photodiode group comprised of one or more photodiodes PD in a column direction. More specifically, each pixel unit 23 is comprised of two photodiodes (e.g., photoiodes PD0 and PD1 or photodiodes PD2 and PD3) Further, the photodiodes are respectively provided with color filters. In the example shown in FIG. 2, an arrangement of color filters of a Bayer system is adopted. In the Bayer system, the color filters of green (G) large in terms of the proportion which contributes to a brightness signal are arranged checkerwise, and the color filters of red (R) and blue (B) are arranged checkerwise in the remaining portion. Further, since the pixel array 22 is operated with the above-described pixel units as the units, a description will be made below about the configuration and operation of each pixel unit.

<Description Related to Circuit of Pixel Unit>

Figure 3:
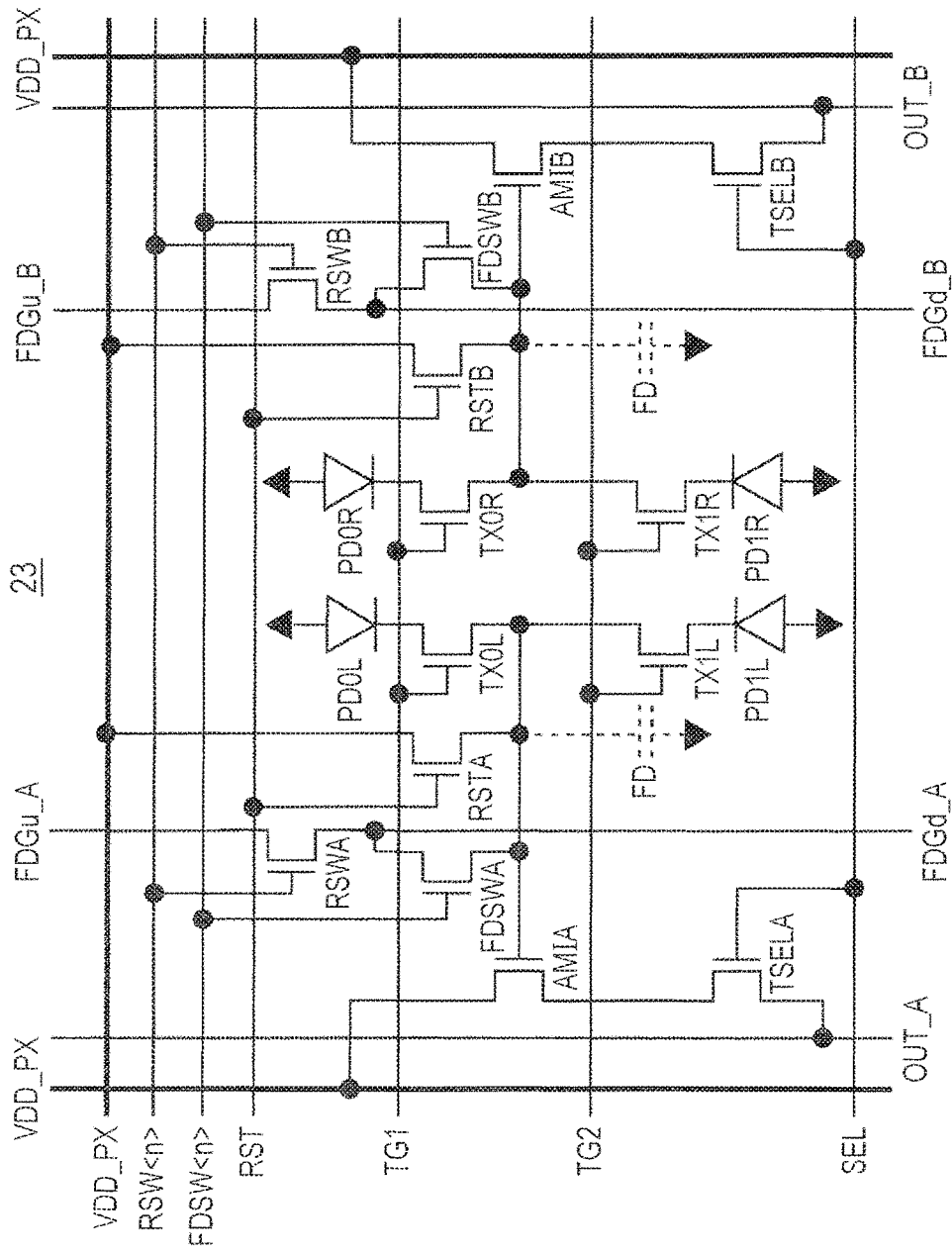
FIG. 3 is a circuit diagram of a pixel unit of the imaging device according to the embodiment 1.

A circuit diagram of the pixel unit of the imaging device according to the embodiment 1 is shown in FIG. 3. The example shown in FIG. 3 shows the pixel unit 23 having the photodiodes PD0 and PD1. The photodiode PD0 corresponds to, for example, the color filter of green, and the photodiode PD1 corresponds to, for example, the color filter of red.

As shown in FIG. 3, in the pixel unit 23, one light receiving element corresponding to the color filter of green is configured by a first photoelectric conversion element (e.g., photodiode PD0L) and a second photoelectric conversion element (e.g., photodiode PD0R). Although described later in detail, the photodiode PD0L and the photodiode PD0R receive light incident through a microle s provided in common. Further, the photodiode PD0L and the photodiode PD0R are provided in positions adjacent to each other.

Also, in the pixel unit 23, one light receiving element corresponding to the color filter of red is configured by a third photoelectric conversion element (e.g., photodiode PD1L) and a fourth photoelectric conversion element (e.g., photodiode PD1R). The photodiode PD1L and the photodiode PD1R receive light incident through a microlens provided in common. Further, the photodiode PD1L and the photodiode PD1R are provided in positions adjacent to each other.

Further, in the pixel unit a first transfer transistor (e.g., transfer transistor TX0L) is provided with respect to the photodiode PD0L, and a second transfer transistor (e.g., transfer transistor TX0R) is provided with respect to the photodiode PD0R. A first read timing signal wiring TG1 which provides a common first read timing signal is coupled to gates of the transfer transistor TX0L and the transfer transistor TX0R. Moreover, in the pixel unit 23, a third transfer transistor (e.g., transfer transistor TX1L) is provided with respect to the photodiode PD1L, and a fourth transfer transistor (e.g., transfer transistor TX1R) is provided with respect to the photodiode PD1R. A second read timing signal wiring TG2 which provides a common second read timing signal is coupled to gates of the transfer transistor TX1L and the transfer transistor TX1R. The second read timing signal becomes an enable state at a timing different from that for the first read timing signal.

Drains of the transfer transistors TX0L and TX1L serve as a first floating diffusion FD. Then, the drains of the transfer transistor TX0L and the transfer transistor TX1L are coupled to a gate of a first amplifier transistor (e.g., amplifier transistor MTA). Further, the drains of the transfer transistor TX0L and the transfer transistor TX1L are coupled to a source of a first reset transistor (e.g., reset transistor RSTA). A power supply voltage is supplied via a power supply wiring VDD PX to a drain of the reset transistor RSTA. The amplifier transistor amplifies a first voltage generated by electric charges outputted via the transfer transistors TX0L and TX1L and outputs the same to a first output wiring OUT_A. More specifically, the amplifier transistor AMIA has a drain coupled to the power supply wiring VDD_PX and a source coupled to the first output wiring OUT_A through a first selection transistor (e.g., selection transistor TSELA). Further, the first output wiring OUT_A outputs an output signal generated based on the electric charges read via the transfer transistors TX0L and TX1L. Incidentally, a selection signal wiring SEL which provides a selection signal is coupled to a gate of the selection transistor TSELA.

Drains of the transfer transistors TX0R and TX1R serve as a second floating diffusion FD. Then, the drains of the transfer transistor TX0R and the transfer transistor TX1R are coupled to a gate of a second amplifier transistor (e.g., amplifier transistor AMIB). Further, the drains of the transfer transistor TX0R and the transfer transistor TX1R are coupled to a source of a second reset transistor (e.g., reset transistor RSTB). The power supply voltage is supplied via the power supply wiring VDD_PX to a drain of the reset transistor RSTB. The amplifier transistor AMIB amplifies a second voltage caused by electric charges outputted via the transfer transistors TX0R and TX1R and outputs the same to a second output wiring OUT_B. More specifically, the amplifier transistor AMIB has a drain coupled to the power supply wiring VDD_PX and a source coupled to the second output wiring OUT_B through a second selection transistor (e.g., selection transistor TSELB) Further, the second output wiring OUT_B outputs an output signal generated based on the electric charges read via the transfer transistors TX0R and TX1R. Incidentally, the selection signal wiring SEL which provides the selection signal is coupled to a gate of the selection transistor TSELB.

A first common floating diffusion wiring is provided with respect to pixel units adjacent to each other in the column direction, of a plurality of pixel units. A first floating diffusion switch (e.g., floating diffusion switch RSWA) is provided over the first common floating diffusion wiring. The floating diffusion switch RSWA switches whether or not to electrically couple between the pixel units. In the example shown in FIG. 3, a symbol for the first common floating diffusion wiring coupled to the source side of the floating diffusion switch RSWA is assumed to be FDGu_A, and a symbol for the first common floating diffusion wiring coupled to the drain side of the floating diffusion switch RSWA is assumed to be FDGd_A. The first common floating diffusion wiring FDGu_A is coupled to the first common floating diffusion wiring FDGd_A of each upper-order adjacent pixel unit disposed in an upper order (large in row number). The first common floating diffusion wiring FDGd_A is coupled to the first common floating diffusion wiring FDGu_A of each lower-order adjacent pixel unit disposed in a lower order (small in row number) Further, a first common state changeover switch (e.g., common state changeover switch FDSWA) switches an electrical coupling state between the first floating diffusion to which the drains of the transfer transistors TX0L and TX1L are coupled, and the first common floating diffusion wiring FDGd_A.

A second common floating diffusion wiring is provided in common with respect to the pixel units adjacent to each other in the column direction, of the pixel units. A second floating diffusion switch (e.g., floating diffusion switch RSWB) is provided over the second common floating diffusion wiring. The floating diffusion switch RSWB switches whether or not to electrically couple between the pixel units. In the example shown in FIG. 3, a symbol for the second common floating diffusion wiring coupled to the source side of the floating diffusion switch RSWB is assumed to be FDGu_B, and a symbol for the second common floating diffusion wiring coupled to the drain side of the floating diffusion switch RSWB is assumed to be FDGd_B The second common floating diffusion wiring FDGu_B is coupled to the second common floating diffusion wiring FDGd_B of each upper-order adjacent pixel unit disposed in the upper order (large in row number). The second common floating diffusion wiring FDGd_B is coupled to the second common floating diffusion wiring FDGu_B of each lower-order adjacent pixel unit disposed in the lower order (small in row number). Further, a second common state changeover switch (e.g., common state changeover switch FDSWB) switches an electrical coupling state between the second floating diffusion to which the drains of the transfer transistors TX0R and TX1R are coupled, and the second common floating diffusion wiring FDGd_B.

Incidentally, the first floating diffusion switch RSWA and the second floating diffusion switch RSWB are controlled in terms of opening/closing states by a row coupling state switch signal RSW outputted from the row controller 20. Further, the common state changeover switch FDSWA and the common state changeover switch FDSWB are controlled in terms of opening closing states by an FD common state switch signal FDSW outputted from the row controller 20.

Also, the pixel units are provided with color filters respectively provided below microlenses. Further, the first common floating diffusion wiring and the second common floating diffusion wiring couple between the pixel units which are different from each other and in which the color filters formed below the microlenses are the same color.

<Description Related to Layout of Pixel unit>

Figure 4:
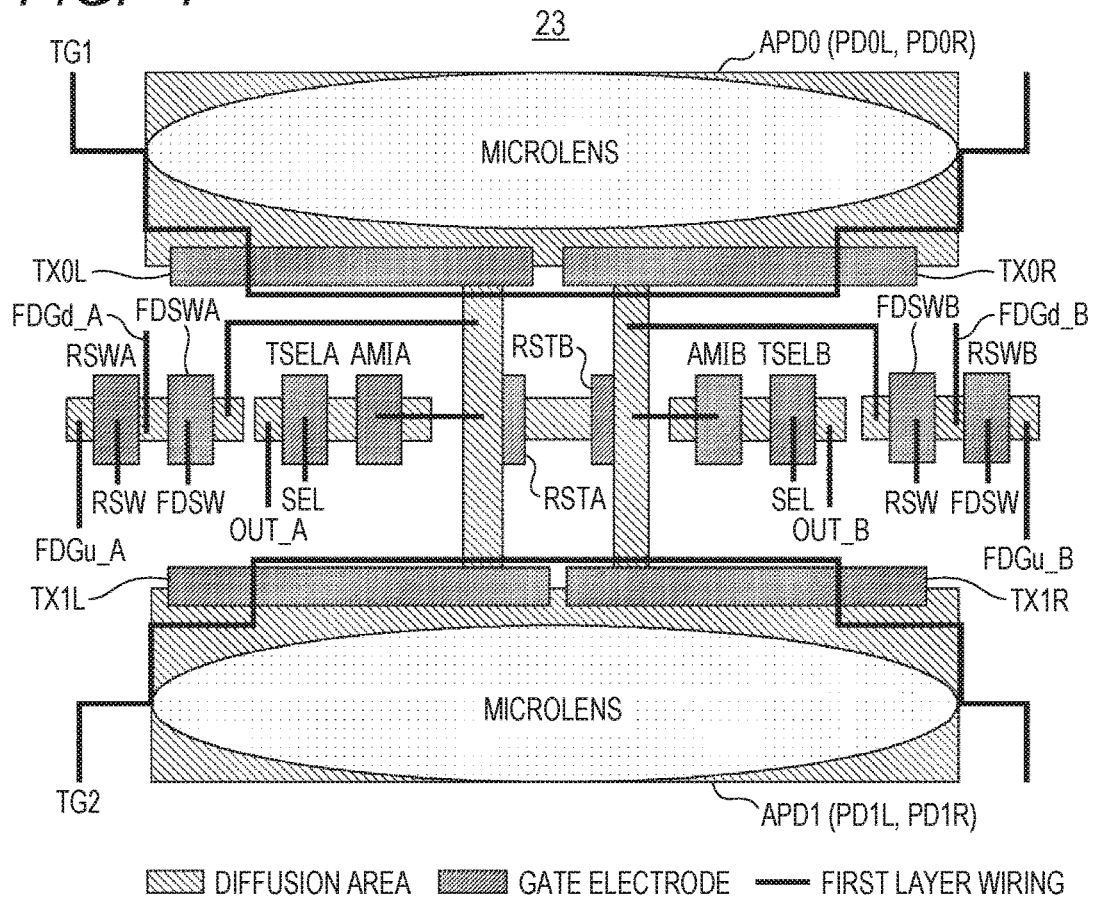
FIG. 4 is a schematic diagram of a layout of the pixel unit of the imaging device according to the embodiment 1.

Subsequently, the layout of the pixel unit 23 according to the embodiment 1 will be described. To this end, a schematic diagram of the layout of the pixel unit 23 according to the embodiment 1 is shown in FIG. 4. Incidentally, the layout diagram illustrated in FIG. 4 shows only one pixel unit. Further, a power supply wiring VDD_PX is not illustrated in FIG. 4.

As shown in FIG. 4, a first photoelectric conversion element area APD0 and a second photoelectric conversion element area APD1 are arranged in the pixel unit 23. In the first photoelectric conversion element area APD0, a first left photoelectric conversion element. (e.g., photodiode PD0L) and a first right photoelectric conversion element (e.g., photodiode PD0R) are formed below one microlens. In the second photoelectric conversion element area APD1, a second left photoelectric conversion element (e.g., photodiode PD1L) and a second right photoelectric conversion element (e.g., photodiode PD1R) are formed below one microlens.

Then, a transfer transistor TX0L is formed at the side of the first photoelectric conversion element area APD0 facing the second photoelectric conversion element area APD1. The transfer transistor TX0L has a gate to which a first read timing signal wiring TG1 is coupled, and is provided corresponding to the photodiode PD0L. A transfer transistor TX0R is formed at the side of the first photoelectric conversion element area APD0 facing the second photoelectric conversion element area APD1. The transfer transistor TX0R has a gate to which the first read timing signal wiring TG1 is coupled, and is provided corresponding to the photodiode PD0R. A transfer transistor TX1L is formed at the side of the second photoelectric conversion element area APD1 facing the first photoelectric conversion element area APD0. The transfer transistor TX1L has a gate to which a second read timing signal wiring TG2 is coupled, and is provided corresponding to the photodiode PD1L. A transfer transistor TX1R is formed at the side of the second photoelectric conversion element area APD1 facing the first photoelectric conversion element area APD0. The transfer transistor TX1R has a gate to which the second read timing signal wiring TG2 is coupled, and is provided corresponding to the photodiode PD1R.

Also, in the pixel unit 23, a diffusion area which serves as a drain of the transfer transistor TX0L, and a diffusion area which serves as a drain of the transfer transistor TX1L are formed in one area. This area becomes a first floating diffusion area. That is, the first floating diffusion area is formed in an area adapted to couple the transfer transistor TX0L and the transfer transistor TX1L. In addition, in the pixel unit 23, a diffusion area which serves as a drain of the transfer transistor TX0R, and a diffusion area which serves as a drain of the transfer transistor TX1R are formed in one area. This area becomes a second floating diffusion area. That is, the second floating diffusion area is formed in an area adapted to couple the transfer transistor TX0R and the transfer transistor TX1R.

Further, in the pixel unit 23, a first reset transistor (e.g., reset transistor RSTB0) is formed to be adjacent to the first floating diffusion area. A second reset transistor (e.g., reset transistor RSTB0) is formed to be adjacent to the second floating diffusion area. Diffusion areas which serve as sources of the reset transistor RSTA0 and the reset transistor RSTB0 are formed in one area.

Furthermore, in the pixel unit 23 an amplifier transistor, a selection transistor, a floating diffusion switch RSWA, and a common state changeover switch FDSWA are formed in an area between the first photoelectric conversion element area APD0 and the second photoelectric conversion element area APD1. More specifically, in the pixel unit 23, an amplifier transistor AMIA, a selection transistor TSELA, a floating diffusion switch RSWA, and a common state changeover switch FDSWA are formed in the left area of the first floating diffusion area in FIG. 4, Then, a gate of the amplifier transistor AMIA is coupled to the first floating diffusion area by using a wiring formed by a first layer wiring. A source of the amplifier transistor AMIA and a drain of the selection transistor TSELA are formed in one area. A first output wiring OUT_A is coupled to a diffusion area which configures a source of the selection transistor TSELA. Further, a drain of the common state changeover switch FDSWA is coupled to the first floating diffusion area by using a wiring formed by the first layer wiring. A common floating diffusion wiring FDGu_A is coupled to a diffusion area which forms a source region of the floating diffusion switch RSWA. A diffusion area which forms a drain region of the floating diffusion switch RSWA, and a diffusion area which forms a source region of the common state changeover switch FDSWA are formed as one diffusion area. Further, a common floating diffusion wiring FDGd_A is coupled to the diffusion area which forms the drain region of the floating diffusion switch RSWA and the source region of the common state changeover switch FDSWA.

Still further, in the pixel unit 23, an amplifier transistor AMIB, a selection transistor TSELB, a floating diffusion switch RSWB, and a common state changeover switch FDSWB are formed in the right area of the second floating diffusion area in FIG. 4. Then, a gate of the amplifier transistor AMIB is coupled to the second floating diffusion area by using a wiring formed by the first layer wiring. A source of the amplifier transistor AMIB and a drain of the selection transistor TSELB are formed in one area. A second output wiring OUT_B is coupled to a diffusion area which configures a source of the selection transistor TSELB. Further, a drain of the common state changeover switch FDSWB is coupled to the second floating diffusion area by using a wiring formed by the first layer wiring. A common floating diffusion wiring FDGu_B is coupled to a diffusion area which forms a source region of the floating diffusion switch RSWB. A diffusion area which forms a drain region of the floating diffusion switch RSWB, and a diffusion area which forms a source region of the common state changeover switch FDSWB are formed as one diffusion area.

Further, a common floating diffusion wiring FDGd_B is coupled to the diffusion area which forms the drain region of the floating diffusion switch RSWB and the source region of the common state changeover switch FDSWB.

<Description Related to Sectional Structure of Pixel Unit>

Figure 5:
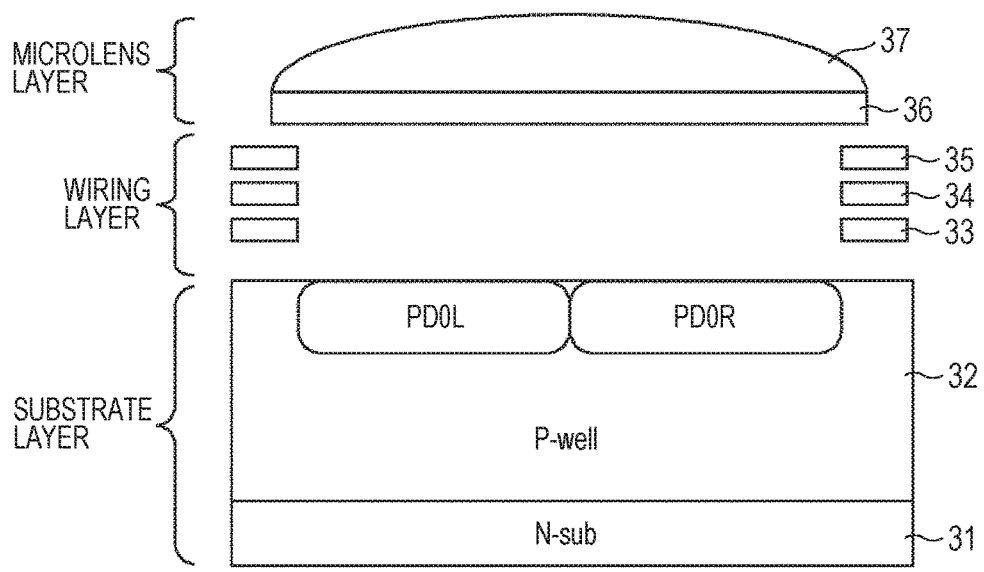
FIG. 5 is a sectional diagram of a photodiode section of the imaging device according to the embodiment 1.

Subsequently, a description will be made about a sectional structure of the first photoelectric conversion element area APD0 of the pixel unit 23. A sectional diagram of a photodiode section included in the first photoelectric conversion element area APD0 of the imaging device according to the embodiment 1 is illustrated in FIG. 5. As shown in FIG. 5, in the pixel unit 23, a P-well layer 32 is formed at an upper layer of an N-sub layer 31, and photodiodes PD0L and PD0R are formed in the surface of the P-well layer 32. Then, wiring layers in which wirings 33 through 35 are formed are provided at an upper layer of a substrate layer comprised of the N-sub layer 31 and the P-well layer 32. A microlens in the pixel unit 23 is formed at the upper layer of the wiring layer. In a microlens layer formed with the microlens, the microlens 37 is formed at an upper layer of a color 36. Further, in the pixel unit 23 as shown in FIG. 5, the microlens 37 is formed so as to cover the photodiode pair.

<Description Related to Coupling Between Pixel Units>

Figure 6:
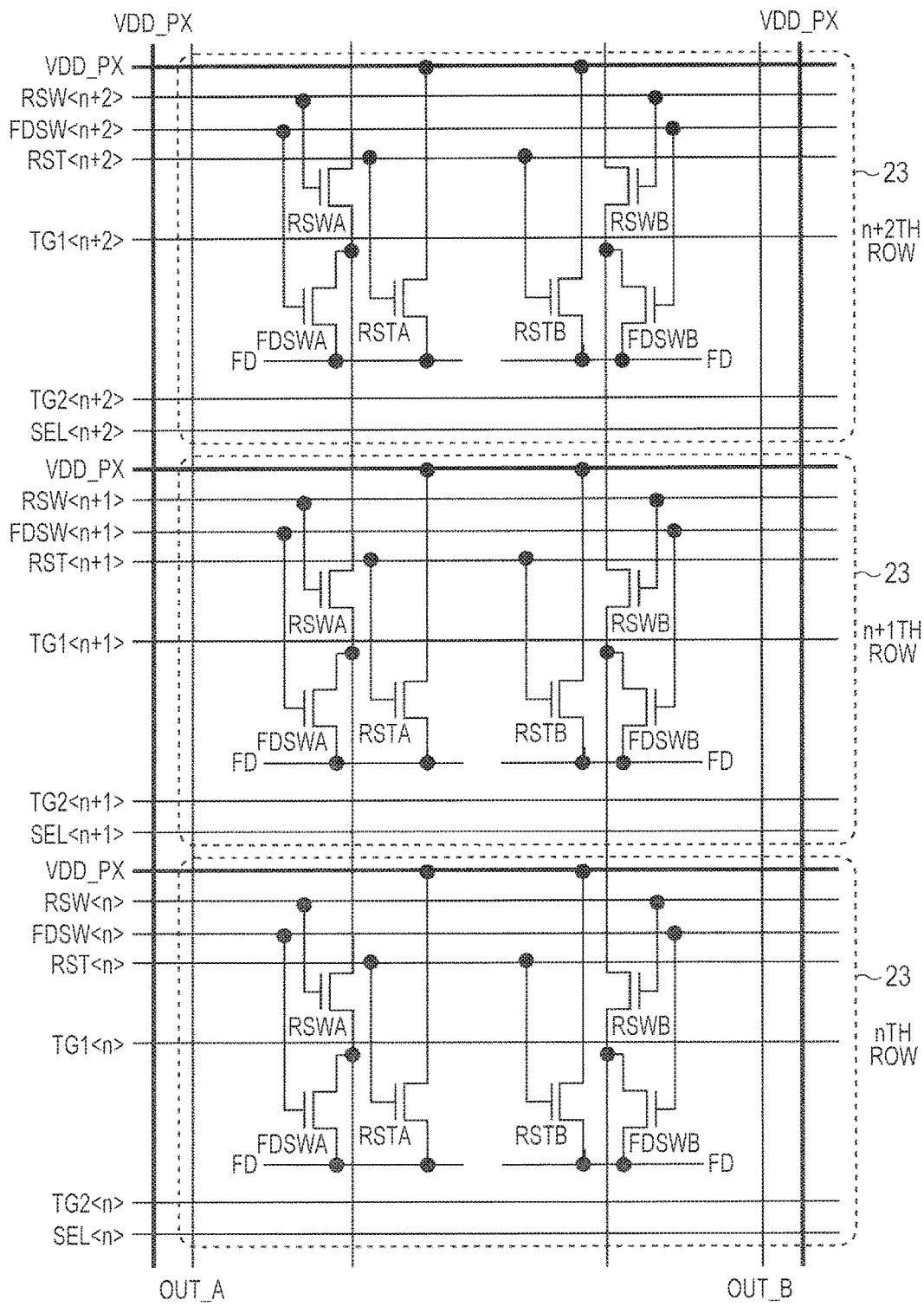
FIG. 6 is a circuit diagram describing a state of coupling between the pixel units in the imaging device according to the embodiment 1.

A description will be made here about a state of coupling between the pixel units in the imaging device according to the embodiment 1. To this end, a circuit diagram describing a state of coupling between the pixel units in the imaging device according to the embodiment 1 is shown in FIG. 6. FIG. 6 shows only elements related to the coupling between the pixel units, of elements in the pixel units, As shown in FIG. 6, in the pixel units according to the embodiment 1, common floating diffusion wirings are provided between the pixel units arranged in the column direction. A state of coupling between a floating diffusion area and a common floating diffusion wiring FDG in each pixel unit is switched by common state changeover switches FDSWA and FDSWB respectively. Also, each of the common state changeover switches FDSWA and FDSWB couples a common floating diffusion wiring which couples its own pixel unit and the pixel unit arranged in a lower order than the own pixel unit, and a floating diffusion area of the own pixel unit. Further, in the pixel units according to the embodiment 1, each of floating diffusion switches RSWA and RSWB is provided over the common floating diffusion wiring, and couples a point where the common floating diffusion wiring FDG and each of the common state changeover switches FDSWA and FDSWB are coupled, and the pixel unit arranged in a higher order than the own pixel unit.

That is, when the floating diffusion switches RSWA and RSWB are turned ON in a state in which the common state changeover switches FDSWA and FDSWB are made turn ON, the floating diffusion area in the own pixel unit is brought into a state of being coupled in parallel with the floating diffusion area of each pixel unit arranged in a higher order than the own pixel unit. Further, when the floating diffusion switches RSWA and RSWB are turned OFF in a state in which the common state changeover switches FDSWA and FDSWB are made to turn ON, the floating diffusion area in the own pixel unit is brought into a state of being electrically separated from the floating diffusion area of each pixel unit arranged in the higher order than the own pixel unit.

<Description Related to Pixel Data Reading Operation>

Subsequently, a description will be made about a reading operation of pixel data of the imaging device according to the embodiment 1. In the imaging device according to the embodiment 1, the number of pixel units which generate pixel data read out in one reading operation can be changed. In the following description, a first example of reading pixel data generated by one pixel unit in one reading operation, a second example of reading pixel data generated by two pixel units in one reading operation, and a third example of reading pixel data generated by three pixel units in one reading operation will be described.

The operation of the row controller 20 in the imaging device according to the embodiment 1 will now be described. In the embodiment 1, the row controller 20 controls the floating diffusion switch RSWA, the floating diffusion switch RSWB, the first common state changeover switch FDSWA, and the second common state changeover switch FDSWB in addition to control of the opening/closing state of each element such as the transfer transistor. Specifically, the row controller 20 determines the numbers of the floating diffusion switches RSWA and the floating diffusion switches RSWB continuously turned ON over the common floating diffusion wirings FDGu_A and FDGd_A and the common floating diffusion wirings FDGu_B and FDGd_B, according to the number of pixel units which read electric charges simultaneously. Further, the row controller 20 turns ON the first common state changeover switch FDSWA and the common state changeover switch FDSWB in each pixel unit which reads the electric charges simultaneously.

Figure 7:
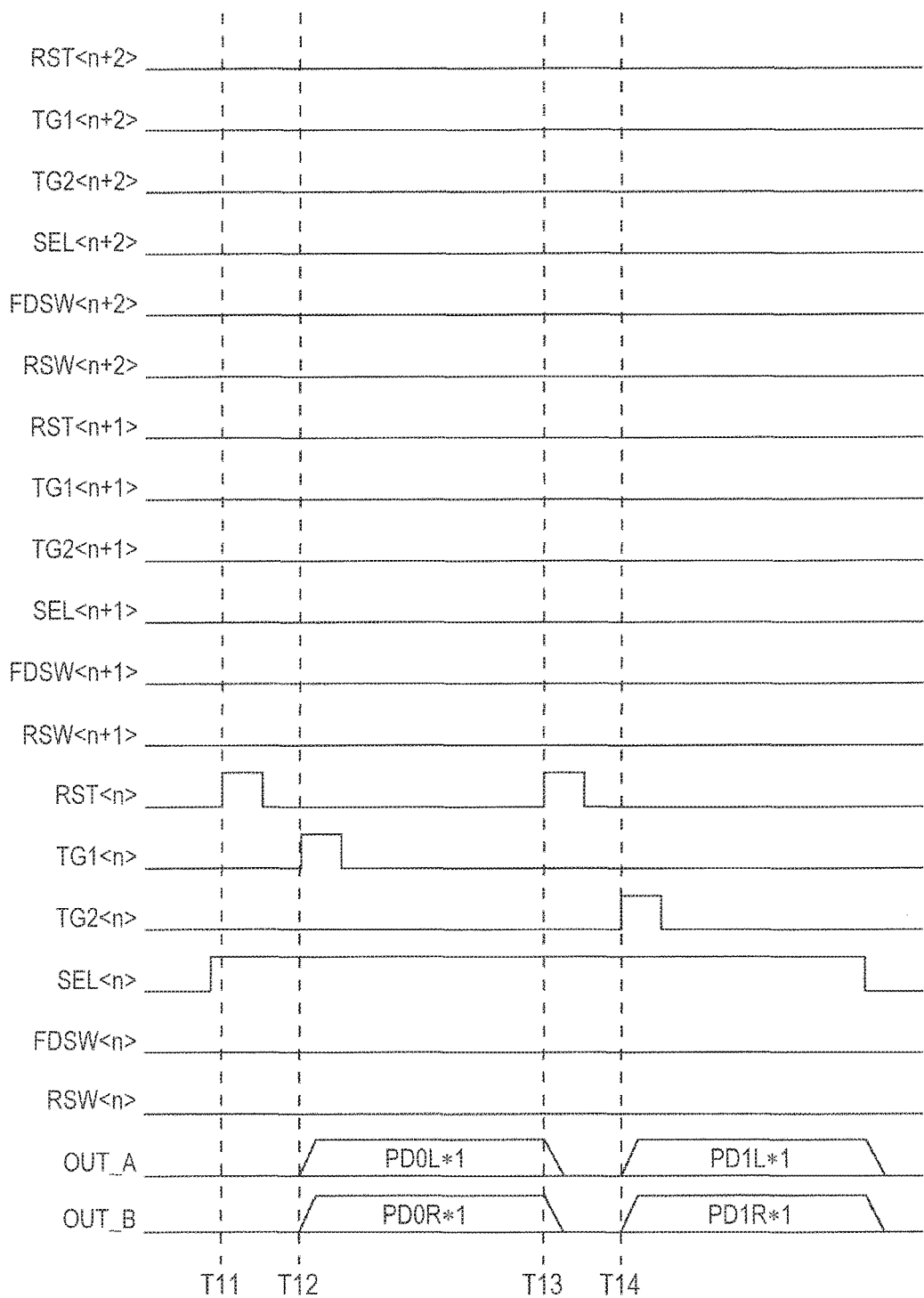
FIG. 7 is a timing chart showing operations where pixel signal corresponding to one row is read from a pixel array according to the embodiment 1.

A timing chart showing operations where pixel data corresponding to one row is read from the pixel array according to the embodiment 1 is shown in FIG. 7. Incidentally, the description of FIG. 7 will be made using symbols attached to the respective wirings for signals transmitted via the respective wirings.

In the first example shown in FIG. the row controller 20 according to the embodiment 1 maintains a row coupling state switch signal RSW and an FD common state switch signal FDSW at a low level. Thus, in the pixel array according to the embodiment 1, floating diffusions FD in each row are respectively brought into an independent state. Further, the row controller 20 according to the embodiment 1 switches a selection signal SEL in an nth row from a low level to a high level during a period prior to a timing T11. Thus, selection transistors TSELA and TSELB of each pixel unit in the nth row are respectively brought into a conducting state. Next, a reset signal RST in the nth row is raised from a low level to a high level at the timing T11. Thus, each floating diffusion FD of the pixel unit in the nth row is reset. Then, after the reset signal in the nth row is switched to the low level again a first read timing signal TG1 in the nth row is raised at a timing T12. Thus, an output signal based on electric charges outputted from a photodiode PD0L is outputted to a first output wiring OUT_A. An output signal based on electric charges outputted from a photodiode PD0R is outputted to a second output wiring OUT_B.

Next, at a timing T13, the reset signal RST in the nth row is raised from the low level to the high level. Thus, each floating diffusion FD of the pixel unit in the nth row is reset. Then, after the reset signal in the nth row is switched to the low level again, a second read timing signal TG2 in the nth row is raised at a timing T14. Thus, an output signal based on electric charges outputted from a photodiode PD1L is outputted to the first output wiring OUT_A. An output signal based on electric charges outputted from a photodiode PD1R is outputted to the second output wiring OUT_B. Further, the reading of pixel data from the pixel unit 23 in the nth row is completed by switching the selection signal SEL from the high level to the low level.

Incidentally, as shown in FIG. 7, when the pixel data is read from the pixel unit corresponding to one row, various control signals given to each pixel unit arranged in each row not to be read are respectively maintained at a low level.

Subsequently, a description will be made about the second example of reading the pixel data generated by the two pixel units in one reading operation. To this end, a timing chart showing operations where pixel data corresponding to two rows are, read from the pixel array according to the embodiment 1 is shown in FIG. 8.

Figure 8:
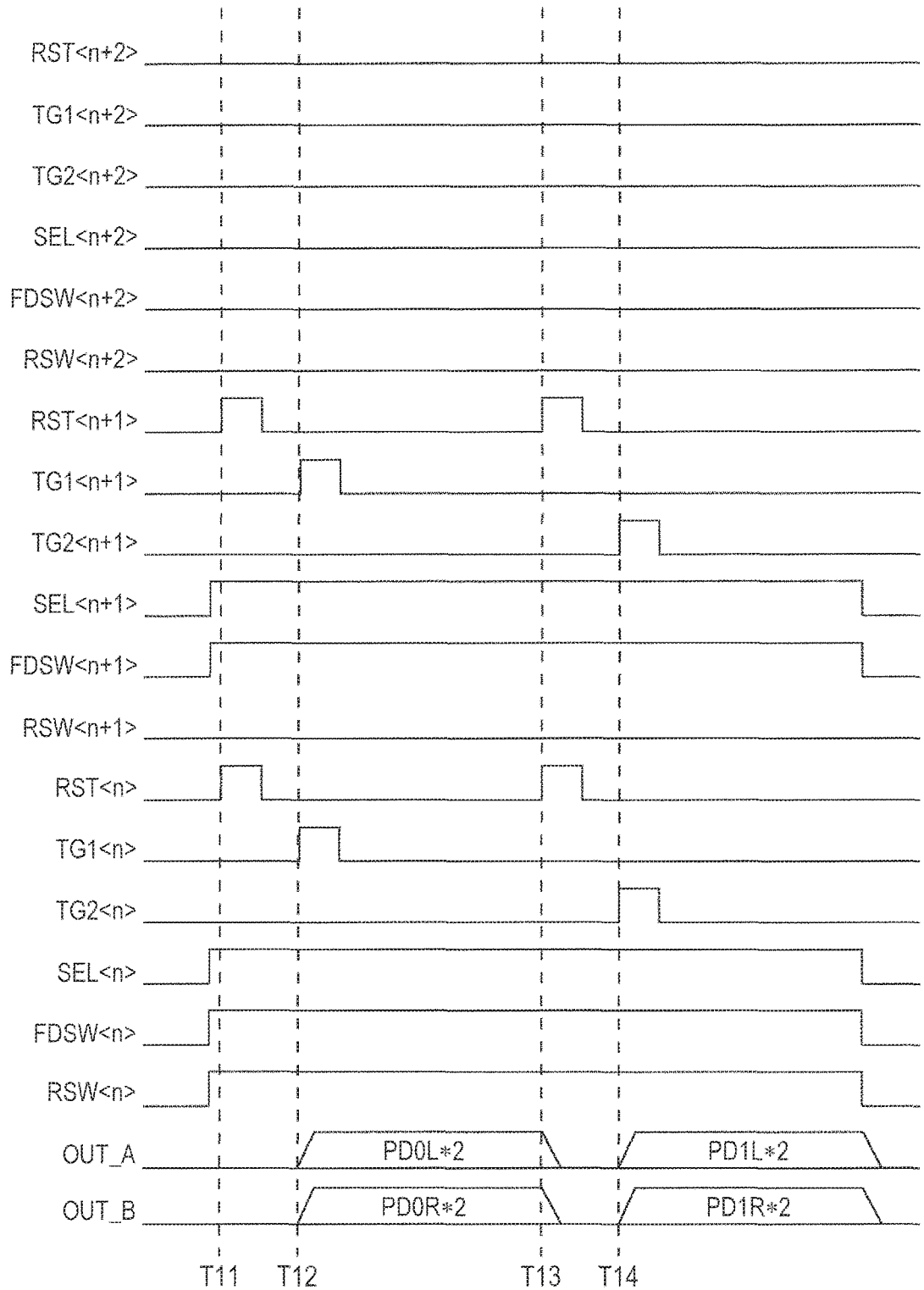
FIG. 8 is a timing chart showing operations where pixel signal corresponding to two rows are read at a time from the pixel array according to the embodiment 1.

In the second example shown in FIG. 8, the row controller 20 according to the embodiment switches a row coupling state switch signal RSW and an FD common state switch signal FDSW in an nth row of rows to be read from a low level to a high level according to a selection signal SEL. Further, the row controller 20 switches even an FD common state switch signal FDSW in an n+1th row of the rows to be read from a low level to a high level according to a selection signal SEL. On the other hand, a row coupling state switch signal RSW in the n+1th row (uppermost row in the rows to be read) is maintained at a low level. Thus, in the pixel array according to the embodiment 1, floating diffusions FD of pixel units in the nth and n+1th rows become parallel coupling, and each floating diffusion FD of a pixel unit in an n+2th row becomes a state of being electrically independent from the floating diffusions FD of the pixel units in the nth and n+1th rows.

Then, in the second example shown in FIG. 8, the row controller 20 according to the embodiment 1 switches selection signals SEL in the nth and n+1th rows from a low level to a high level during a period prior to a timing T11. Thus, selection transistors TSELA, TSELB, TSELA and TSELB of the pixel units arranged in the nth and n+1th rows are respectively brought into a conducting state. Next, reset signals RST in the nth and n+1th rows are raised from a low level to a high level at the timing T11. Thus, the respective floating diffusions FD of the pixel units in the nth and n+11th rows are reset. Then, after the reset signals in the nth and n+1th rows are switched to the low level again, first read timing signals TG1 in the nth and n+1th rows are raised at a timing T12. Thus, an output signal based on electric charges outputted from a photodiode PD0L is outputted to a first output wiring OUT_A. An output signal based on electric charges outputted from a photodiode PD0R is outputted to a second output wiring OUT_B.

Next, at a timing T13, the reset signals RST in the nth and nilth rows are raised from the low level to the high level. Thus, the respective floating diffusions FD of the pixel units in the nth and n+1th rows are reset. Then, after the reset signals in the nth and n+1th rows are switched to the low level again, second read timing signals TG2 in the nth and n+1th rows are raised at a timing T14. Thus, an output sign based on electric charges outputted from a photodiode PD1L is outputted to a first output wiring OUT_A. An output signal based on electric charges outputted from a photodiode PD1R is outputted to a second output wiring OUT_B. Further, the reading of pixel data from the pixel units 23 in the nth and n+1th rows is completed by switching the selection signals SEL from the high level to the low level.

Incidentally, as shown in FIG. 8, when the pixel data is read from the pixel units corresponding to the two rows, various control signals given to each pixel unit arranged in each row not to be read are respectively maintained at a low level. Also, when the pixel data is read from the pixel units corresponding to the two rows, the electric charges generated within the pixel units to be read within pixel circuits are brought into a state of being combined by the floating diffusions FD brought into the parallel-coupled state. Further, amplifier transistors within the pixel units to be read are also brought into a state of being coupled in parallel with respect to output wirings. Therefore, when the pixel data is read from the pixel units corresponding to the two rows, the size of the pixel data becomes approximately two times larger when the pixel data is read from the pixel unit corresponding to one row.

Figure 9:
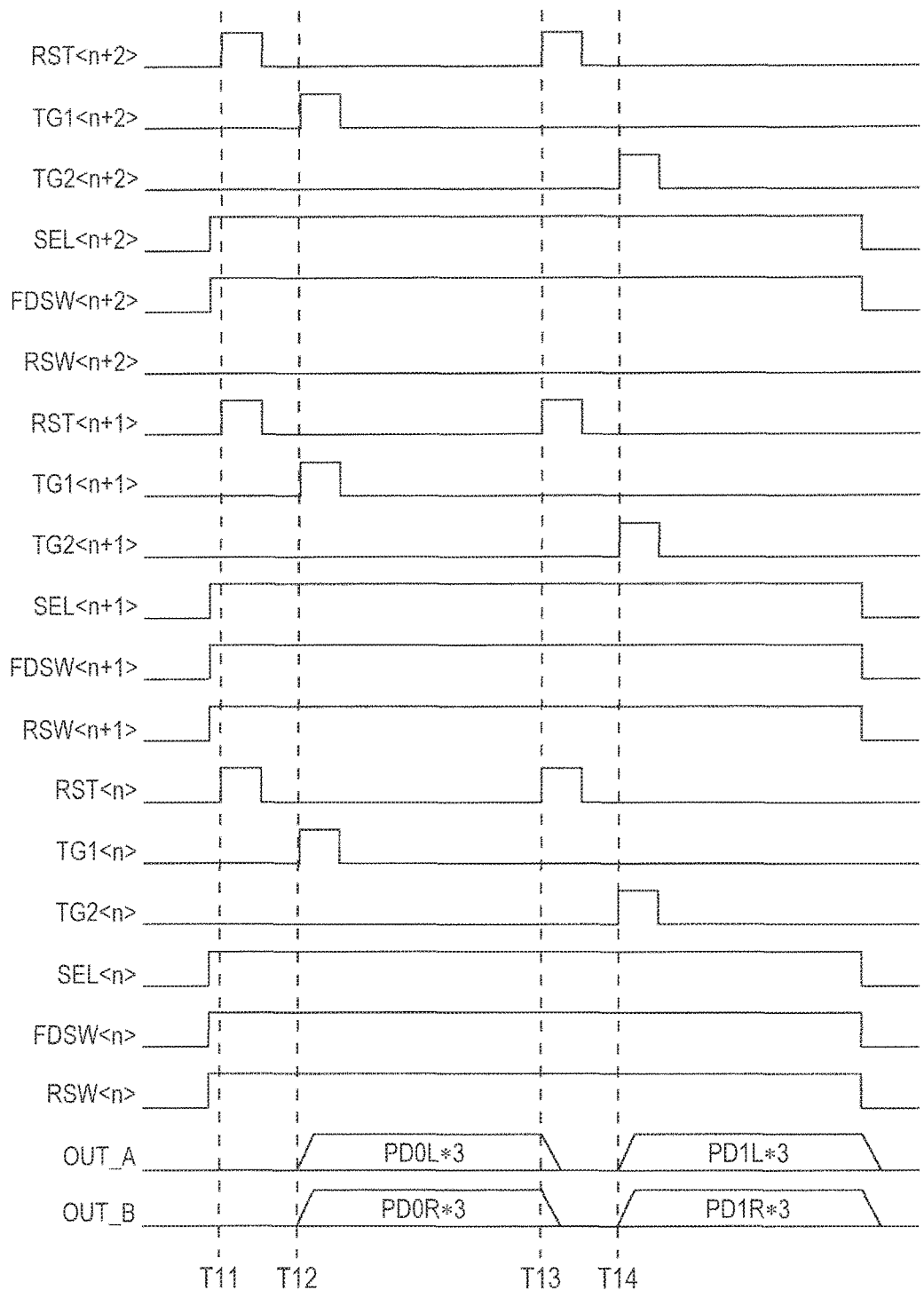
FIG. 9 is a timing chart showing operations where pixel signal corresponding to three rows are read at a time from the pixel array according to the embodiment 1.

Subsequently, a timing chart showing operations where pixel data corresponding to three rows are read from the pixel array according to the embodiment 1 is shown in FIG. 9. In the third example shown in FIG. 9, the row controller 20 according to the embodiment 1 switches row coupling state switch signals RSW and FD common state switch signals FDSW in nth and n+1th rows of rows to be read from a low level to a high level according to selection signals SEL. Further, the row controller 20 switches even an FD common state switch signal FDSW in an n+2th row of the rows to be read from a low level to a high level according to a selection signal SEL. On the other hand, a row coupling state switch signal RSW in the n+2th row (uppermost in the rows to be read) is maintained at a low level. Thus, in the pixel array according to the embodiment 1, floating diffusions FD of the pixel units in the nth to n+2th rows become a state of being coupled in parallel.

Then, in the third example shown in FIG. 9, the row controller 20 according to the embodiment 1 switches the selection signals in the nth to n+2th rows from a low level a high level during a period prior to a timing T11. Thus, selection transistors TSELA, TSELB of the pixel units arranged in the nth to nH-2th rows are respectively brought into a conducting state. Next, reset signals RST in the nth to n+2th rows are raised from a low level to a high level at the timing T11. Thus, the respective floating diffusions FD of the pixel units in the nth to n+2th rows are reset. Then, after the reset signals in the nth to n+2th rows are switched to the low level again, first read timing signals TG1 in the nth to n+2th rows are raised at a timing T12. Thus, an output sign based on electric charges outputted from a photodiode PD0L is outputted to a first output wiring OUT_A. An output signal based on electric charges outputted from a photodiode PD0R is outputted to a second output wiring OUT_B.

Next, at a timing T13, the reset signals RST in the nth to n+2th rows are raised from the low level to the high level. Thus, the respective floating diffusions FD of the pixel units in the nth to n+2th rows are reset. Then, after the reset signals in the nth to n+2th rows are switched to the low level again, second read timing signals TG2 in the nth to n+2th rows are raised at a timing T14. Thus, an output sign based on electric charges outputted from a photodiode PD1L is outputted to the first output wiring OUT_A. An output signal based on electric charges outputted from a photodiode PD1R is outputted to the second output wiring OUT_B. Further, the reading of pixel data from the pixel units 23 in the nth to n+2th rows is completed by switching the selection sign SEL from the high level to the low level.

Incidentally, as shown in FIG. 9, when the pixel data is read from the pixel units corresponding to the three rows, various control signals given to each pixel unit arranged in each row not to be read are respectively maintained at a low level. Also, when the pixel data is read from the pixel units corresponding to the three rows, the electric charges generated within the pixel units to be read within pixel circuits are brought into a state of being combined by the floating diffusions FD brought into the parallel-coupled state. Further, the amplifier transistors within the pixel units to be read are also brought into a state of being coupled in parallel with respect to the output wirings. Therefore, when the pixel data is read from the pixel units corresponding to the three rows, the size of the pixel data becomes approximately three times larger when the pixel data is read from the pixel unit corresponding to one row.

<Description of SN Ratio of Pixel Data Read from Plural Pixel Units>

A description will now be made about an SN ratio of pixel data read in the pixel array according to the embodiment 1. To this end, a diagram describing an SN ratio in the imaging device according to the embodiment 1 is shown in FIG. 10. First, in the imaging device according to the embodiment 1 as shown in FIG. 10, various noises are mixed into pixel data read from each pixel by the influence of noise generated due to impurities crept into a semiconductor or noise mixed into a power supply, or the like. The example illustrated in FIG. 10 has shown pixel noise Npix and circuit noise Ncir generated within each pixel unit by classifying these noises. Further, in the imaging device according to the embodiment 1, averaging processing is performed on two pieces of pixel data read from a pair of pixels to generate pixel data.

A top diagram of FIG. 10 is a diagram describing an SN ratio of pixel data read from each pixel unit corresponding to one row. As shown in the top diagram of FIG. 10, an SN ratio of pixel data generated from the pixel data read from the pixel unit corresponding to one row is represented by the following equation (1):

$$\frac{Stotal}{Ntotal} = \frac{S}{\sqrt{2Npix^2 + 2Ncir^2 + S}} \quad (1)$$

On the other hand, the bottom diagram of FIG. 10 is a diagram describing an SN ratio of pixel data read from pixel units corresponding to three rows. As shown in the bottom diagram of FIG. 10, an SN ratio of pixel data generated from the pixel data read from the pixel units corresponding to the three rows is represented by the following equation (2):

$$\frac{Stotal}{Ntotal} = \frac{3S}{\sqrt{2Npix^2 + 2Ncir^2 + 3S}} \quad (2)$$

It is understood that when the equation (1) and the equation (2) are compared with each other, the SN ratio of the pixel data outputted by the imaging device according to the embodiment 1 becomes higher than when the pixel data is read at a time from the pixel unit corresponding to one row, where the pixel data is read at a time from the pixel units corresponding to the three rows. The reason why such a difference in SN ratio occurs due to a difference in the number of the pixel units to be read is that since the pixel array according to the embodiment 1 outputs the pixel data to each of subsequent-stage amplifiers ampL and ampR after the electric charges are combined within the pixel units, the signal level of the pixel data becomes larger than a noise level.

From the above description, the imaging device 15 according to the embodiment 1 has the floating diffusion switches and common state changeover switches which switch the parallel number of the floating diffusions FD in each pixel unit. Thus, in the imaging device 15 according to the embodiment 1, since the signal level of the pixel data can be made large based on the processing of combining of the electric charges, which is carried out at a stage before outputting the pixel data from the pixel array, it is possible to enhance the SN ratio of the pixel data outputted from the pixel array. Further, with the improvement in the SN ratio of the pixel data, the range of the dynamic range of brightness at which a difference in contrast can be obtained can be enlarged.

Further, in the imaging device 15 according to the embodiment 1, the parallel number of the floating diffusions FD is switched between the pixel units in which the colors to which the color filters correspond are the same. Thus, the imaging device 15 according to the embodiment 1 is capable of preventing the color mixture of the pixel data.

Moreover, in the imaging device 15 according to the embodiment 1, the number of the pixel data relative to the number of the pixel units can be reduced by parallelizing the floating diffusions FD. Thus, the imaging device 15 according to the embodiment 1 is capable of shortening the time required to read the pixel data. For example, although the imaging device 15 according to the embodiment 1 is capable of generating the phase difference data for performing the autofocus control, based on the difference between the two pieces of pixel data outputted from the pair of photodiodes arranged in one pixel, the number of pixels required for this autofocus control may be smaller than the number of pixels arranged in the pixel array. Thus, the use of the imaging device 15 according to the embodiment 1 makes it possible to reduce the pixel data read upon the autofocus control and shorten the time required for the autofocus control Embodiment 2

An embodiment 2 will describe a pixel unit 23*a* as a form different from the pixel unit 23 according to the embodiment 1. To this end, a circuit diagram of the pixel unit 23*a* according to the embodiment 2 is illustrated in FIG. 11.

Figure 11:
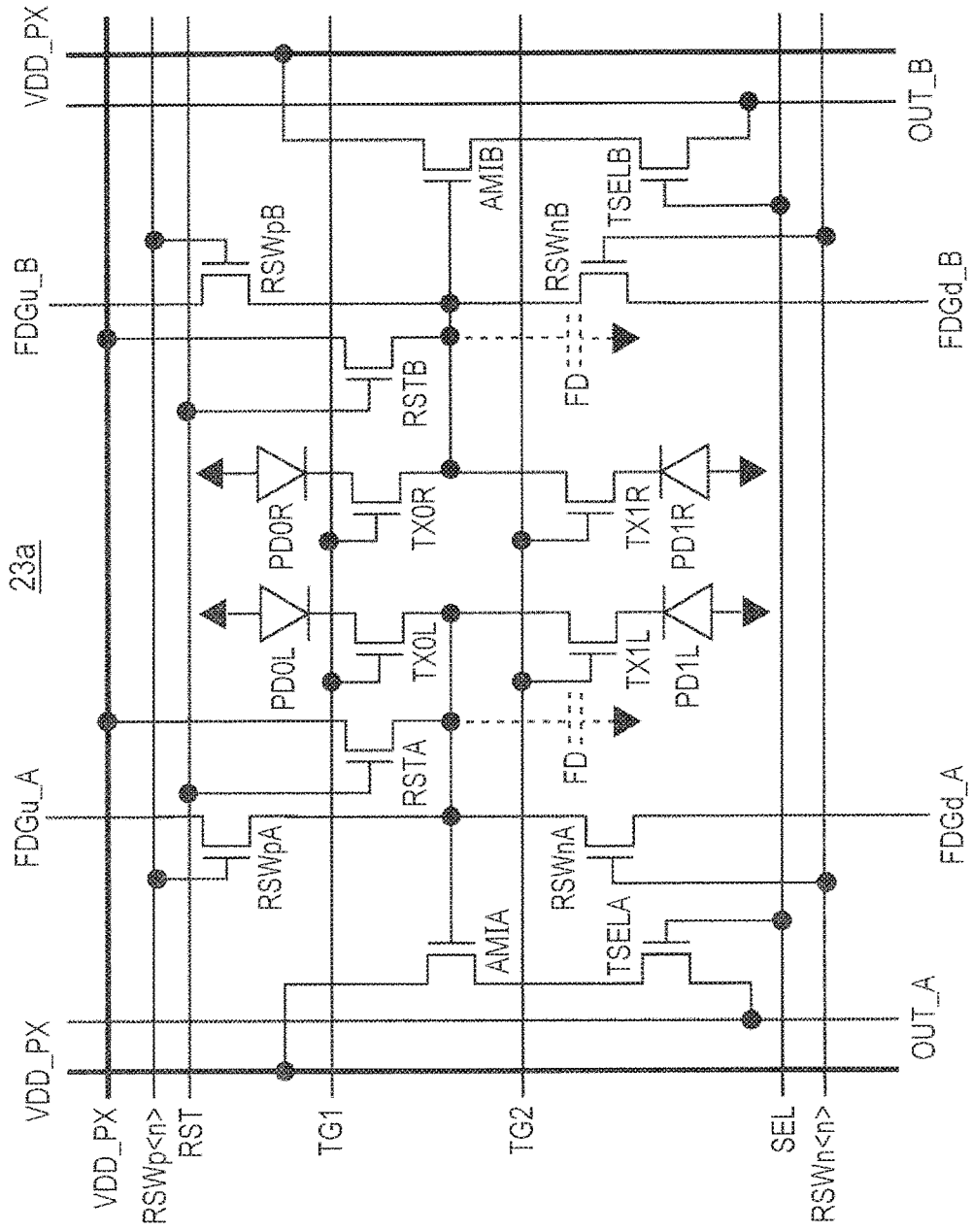
FIG. 11 is a circuit diagram of a pixel unit of an imaging device according to an embodiment 2.

As shown in FIG. 11, the pixel unit. 23*a* according to the embodiment 2 has first through fourth floating diffusion switches (e.g., floating diffusion switches RSWpA, RSWnA, RSWpB, RSWnB) in place of the floating diffusion switches RSWA and RSWB and the common state changeover switches FDSWA and FDSWB in the pixel unit 23 according to the embodiment 1.

The floating diffusion switch RSWpA is coupled between a first common floating diffusion wiring (e.g., common floating diffusion wiring FDGu_A) provided in common with respect to upper-order adjacent pixel units adjacent in an upper-order direction (direction large in row number) as viewed in a column direction, and a first floating diffusion FD to which transfer transistors TX0L and TX1L are coupled. The floating diffusion switch RSWpA is controlled an opened/closed state of coupling, based on a first row coupling state switch signal RSWp outputted from a row controller 20.

The floating diffusion switch RSWnA is coupled between a second common floating diffusion wiring (e.g., common floating diffusion wiring FDGd_A) provided in common with respect to lower-order adjacent pixel units adjacent in a low-order direction (direction small in row number) as viewed in the column direction, and the first floating diffusion FD to which the transfer transistors TX0L and TX1L are coupled. The floating diffusion switch RSWnA makes an opened/closed state of coupling, based on a second row coupling state switch signal RSWn outputted from the row controller 20.

The floating diffusion switch RSWpB is coupled between a third common floating diffusion wiring (e.g., common floating diffusion wiring FDGu_B) provided in common with respect to the upper-order adjacent pixel units adjacent in the upper-order direction (direction large in row number) as viewed in the column direction, and a second floating diffusion FD to which transfer transistors TX0R and TX1R are coupled. The floating diffusion switch RSWpB makes an opened/closed state of coupling, based on the first row coupling state switch signal RSWp outputted from the row controller 20.

The floating diffusion switch RSWnB is coupled between a fourth common floating diffusion wiring (e.g., common floating diffusion wiring FDGd_B) provided in common with respect to the lower -order adjacent pixel units adjacent in the low-order direction (direction small in row number) as viewed in the column direction, and the second floating diffusion FD to which the transfer transistors TX0R and TX1R are coupled. The floating diffusion switch RSWnB makes an opened/closed state of coupling, based on the second row coupling state switch signal RSWn outputted from the row controller 20.

Subsequently, a description will be made about the operation of reading pixel data in an imaging device according to the embodiment 2. In the imaging device according to the embodiment 2, the number of pixel units which generate pixel data read in one reading operation can be changed. While the number of pixel units capable of reading pixel data simultaneously can be changed even in the imaging device according to the embodiment 2, the following description will be made about only a third example of reading pixel data generated by three pixel units in one reading operation.

The operation of the row controller 20 in the imaging device according to the embodiment 2 will now be described. In the embodiment 2, the row controller 20 controls the floating diffusion switches RSWpA, RSWnA, RSWpB, and RSWnB in addition to control of the opening/closing state of each element such as the transfer transistor. Specifically, the row controller 20 turns OFF the floating diffusion switches RSWpA and RSWpB which belong to the pixel unit positioned at the top of the pixel units which read electric charges simultaneously and turns OFF the floating diffusion switches RSWnA and RSWnB which belong to the pixel unit positioned at the bottom of the pixel units which read electric charges simultaneously. Further, the row controller 20 turns ON a floating diffusion switch RSWpA and a floating diffusion switch RSWnA interposed by the floating diffusion switch RSWpA and the floating diffusion switch RSWrA both brought into the OFF state. The row controller 20 turns ON a floating diffusion switch RSWpB and a floating diffusion switch RSWnB interposed by the floating diffusion switch RSWpB and the floating diffusion switch RSWnB both brought into the OFF state.

Figure 12:
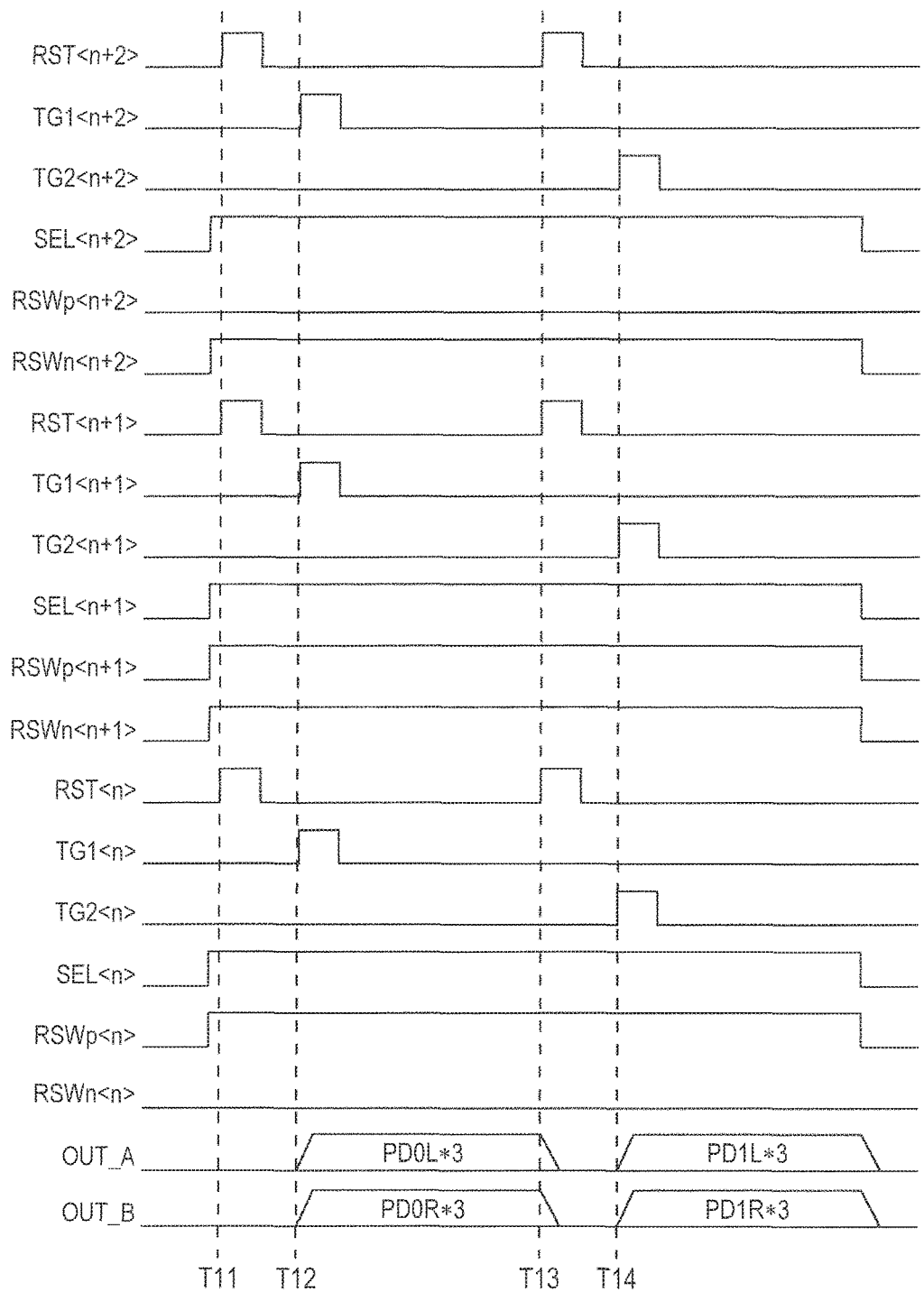
FIG. 12 is a timing chart showing operations where pixel signal corresponding to three rows are read at a time from a pixel array according to the embodiment 2.

A timing chart showing operations where pixel data corresponding to three rows are read from a pixel array according to the embodiment 2 is shown in FIG. 12. Incidentally, the description of FIG. 12 will be made using symbols attached to the respective wirings for signals transmitted via the respective wirings.

In the third example shown in FIG. 12, the row controller 20 according to the embodiment 2 maintains at a low level, a first row coupling state switch signal RSWp in an n+2th row as the top of rows to be read and a second row coupling state switch signal RSWn in an nth row as the bottom of the rows to be read. On the other hand, the row controller 20 according to the embodiment 2 switches a first row coupling state switch signal RSWp and a second row coupling state switch signal RSWn given to floating diffusion switches RSWpA, RSWnA, RSWpB, and RSWnB interposed by the floating diffusion switches RSW RSWnA, RSWpB, and RSWnB respectively supplied with the row coupling state switch signals maintained at the low level, from a low level to a high level according to a selection signal SEL.

Further, in the third example shown in FIG. 12, the row controller 20 according to the embodiment 2 switches selection signals SEL in the nth to n+2th rows from a low level to a high level during a period prior to a timing. Thus, selection transistors TSELA, TSELB of pixel units arranged in the nth to n-+2th rows are respectively brought into a conducting state. Next, reset signals RST in the nth to n+2th rows are raised from a low level to a high level at the timing T11. Thus, respective floating diffusions FD of the pixel units in the nth to n+2th rows are reset. Then, after the reset signals in the nth to n+2th rows are switched to the low level again, first read timing signals TG1 in the nth to n-+2th rows are raised at a timing T12. Thus, an output signal based on electric charges outputted from a photodiode PD0L is outputted to a first output wiring OUT_A. An output signal based on electric charges outputted from a photodiode PD0R is outputted to a second output wiring OUT_B.

Next, at a timing T13, the reset signals RST in the nth to n+2th rows are raised from the low level to the high level. Thus, the respective floating diffusions FD of the pixel units in the nth to n+2th rows are reset. Then, after the reset signals in the nth to n+2th rows are switched to the low level again, second read timing signals TG2 in the nth to n+2th rows are raised at a timing T14. Thus, an output sign based on electric charges outputted from a photodiode PD1L is outputted to the first output wiring OUT_A. An output signal based on electric charges outputted from a photodiode PD1R is outputted to the second output wiring OUT_B. Further, the reading of pixel data from the pixel units 23 in the nth to n+2th rows is completed by switching the selection sign SEL from the high level to the low level.

Incidentally, when the pixel data is read from the pixel units corresponding to the three rows, the electric charges generated within the pixel units to be read within pixel circuits are brought into a state of being combined by the floating diffusions FD brought into the parallel-coupled state. Further, amplifier transistors within the pixel units to be read are also brought into a state of being coupled in parallel with the output wirings. Therefore, when the pixel data is read from the pixel units corresponding to the three rows, the size of the pixel data becomes approximately three times larger when the pixel data is read from the pixel unit corresponding to one row.

From the above description, even in the pixel unit 23a according to the embodiment 2, the combining of the pixel data is performed within the pixel unit in a manner similar to the pixel unit 23 according to the embodiment 1, and thereby the SN ratio of the pixel data can be improved.

Incidentally, in the pixel unit 23*a* according to the embodiment 2, the number or the transistors coupled to the floating diffusion becomes larger by one than the pixel unit 23 according to the embodiment 1 . Therefore, when the parasitic capacity of each floating diffusion is increased, the pixel unit 23*a* according to the embodiment 2 is ore advantageous than the pixel unit 23 according to the embodiment 1.

Embodiment 3

Figure 13:
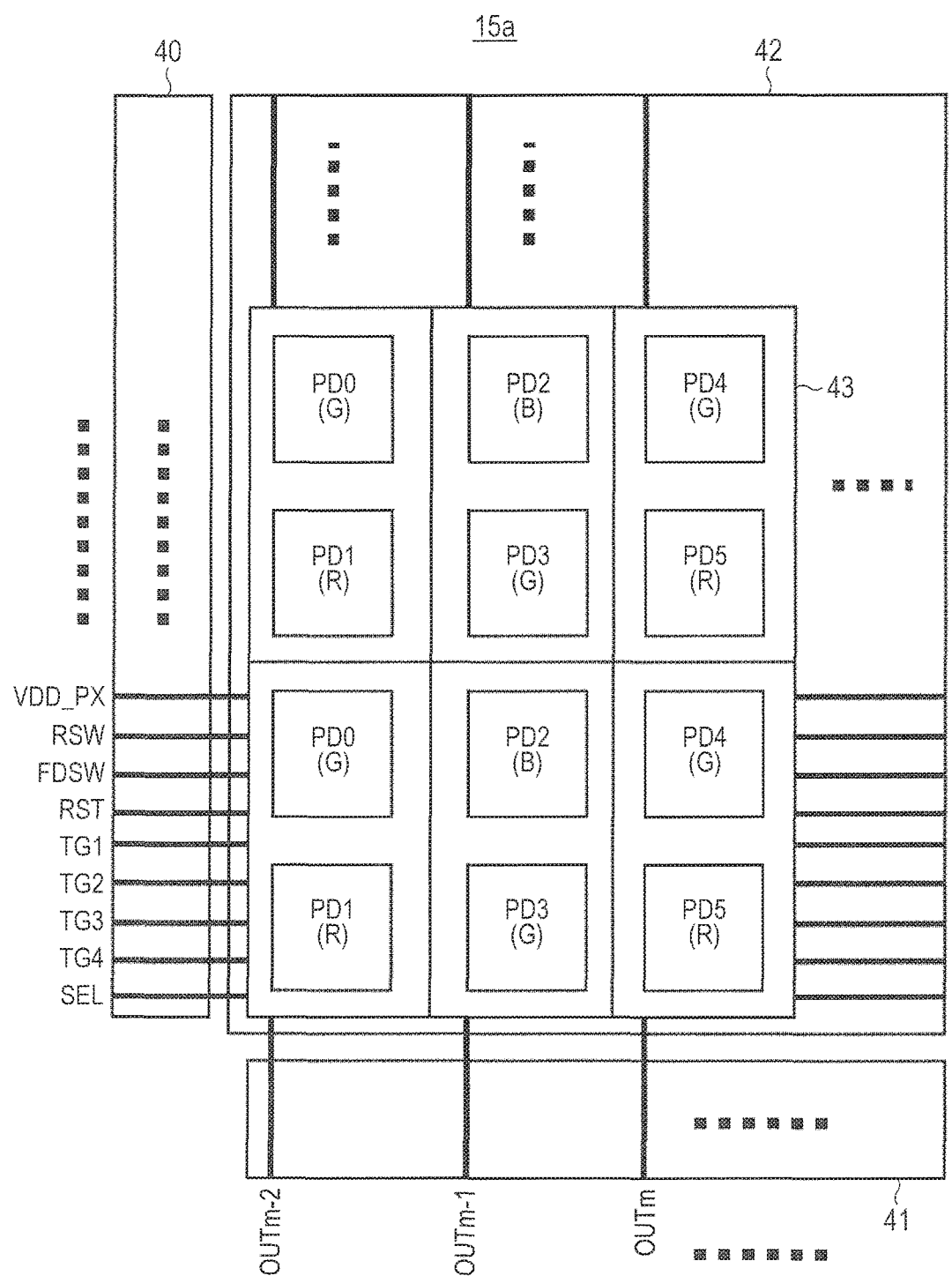
FIG. 13 is a schematic diagram of a floor layout of an imaging device according to an embodiment 3.

An embodiment 3 will describe an imaging device 15*a* as a form different from the imaging device 15 according to the embodiment 1. To this end, a schematic diagram of a floor layout of the imaging device 15*a* according to the embodiment 3 is shown in FIG. 13. Incidentally, of the floor layout of the imaging device 15, only the floor layouts of a row controller 40, a column controller 41, and a pixel array 42 are shown in FIG. 13.

As shown in FIG. 13, the imaging device 15*a* has the row controller 40, the column controller 41, and the pixel array 42. The row controller 40 is substantially identical to the row controller 20, but different from the row controller 20 in that it outputs first through fourth read timing signals as read timing signals. The column controller 41 is substantially identical to the column controller 21, but different from the column controller 21 in that the number of outputs signals acquired from pixel units arranged in the same column is one.

The pixel array 42 has pixel units 43 arranged in a lattice form. Even in the example shown in FIG. 13, each pixel unit 43 includes a photodiode group comprised of one or more photodiodes PD in a column direction. More specifically, each pixel unit 43 is comprised of two photodiodes. Incidentally, the photodiodes shown in FIG. 13 respectively include two photodiodes (e.g., left photoelectric conversion element and right photoelectric on version element) disposed below one microlens. In the pixel units 43, amplifier transistors and output wirings are shared between the pixel units adjacent the column direction (transverse direction in the figure). More specifically, the amplifier transistor to which the right photoelectric conversion element of the left pixel unit is coupled is used even for the output of the left photoelectric conversion element of the right pixel unit. A description will therefore be made below about the configuration and operation of each pixel unit.

Figure 14:
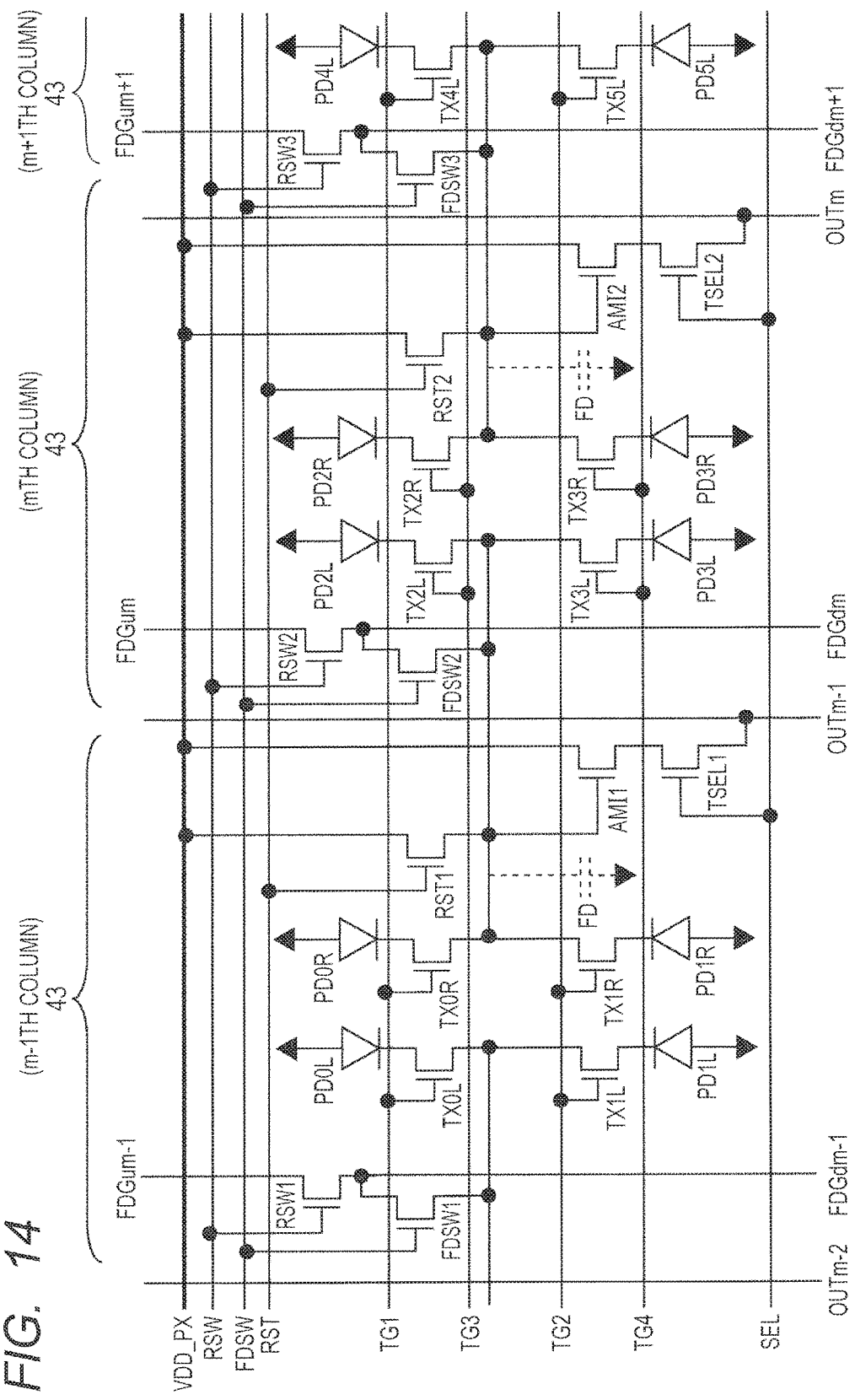
FIG. 14 is a circuit diagram of pixel units of the imaging device according to the embodiment 3.

A circuit diagram of pixel units in the imaging device 15*a* according to the embodiment 2 is shown in FIG. 14. FIG. 14 shows pixel units 43 corresponding to 2.5 pieces. In the description of the pixel units shown in FIG. 14, at the pixel units 43 arranged in odd-numbered columns (e.g., m−1th row and m+1th row), the photodiodes arranged on the upper side of the drawing are assumed to be a first photoelectric conversion element (e.g., photodiode PD0L) and a second photoelectric conversion element (e.g., photodiode PD0R), and photodiodes arranged on the lower side of the drawing are assumed to be a third photoelectric conversion element (e.g., photodiode PD1L) and a fourth photoelectric conversion element (e.g., photodiode PD1R) Further, the photodiode PD0L provided with a first transfer transistor (e.g., transfer transistor TX0L). The photodiode PD0R is provided with a second transfer transistor (e.g., transfer transistor TX0R). The photodiode PD1L is provided with a third transfer transistor (e.g., transfer transistor TX1L). The photodiode PD1R is provided with a fourth transfer transistor (e.g., transfer transistor TX1R).

On the other hand, in each pixel unit 43 arranged in an even-numbered column (e.g., mth column), photodiodes arranged on the upper side in the drawing are assumed to be a fifth photoelectric conversion element (e.g., photodiode PD2L) and a sixth photoelectric conversion element (e.g., photodiode PD2R). Photodiodes arranged on the lower side in the drawing are assumed to be a seventh photoelectric conversion element (e.g., photodiode PD3L) and an eighth photoelectric conversion element (e.g., photodiode PD3R). Further, the photodiode PD2L is provided with a fifth transfer transistor (e.g., transfer transistor TX2L). The photodiode PD2R is provided with a sixth transfer transistor (e.g., transfer transistor TX2R). The photodiode PD3L is provided with a seventh transfer transistor (e.g., transfer transistor TX3L). The photodiode PD3R is provided with an eighth transfer transistor (e.g., transfer transistor TX3R).

Further, in the imaging device 15*a* as shown in FIG. 14, a first read timing signal wiring TG1 is coupled to gates of the transfer transistors TX0L and TX0R included in the pixel unit 43 arranged in the odd-numbered column. A second read timing single wiring TG2 is coupled to gates of the transfer transistors TX1L and TX1P included in the pixel unit 43 arranged in the odd-numbered column. A third read timing signal wiring TG3 is coupled to gates of the transfer transistors TX2L and TX2R included in the pixel unit 43 arranged in the even-numbered column. A fourth read timing signal wiring TG4 is coupled to gates of the transfer transistors TX3L and TX3R included in the pixel unit 43 arranged in the even-numbered column. Incidentally, read timing signals transmitted via the read timing signal wirings respectively become an enable state (e.g., high level) at timings different from each other.

Then, in the imaging device 15*a* as shown in FIG. 14, the output of a photodiode (e.g., photodiode PD2L) corresponding to the left photoelectric conversion element of each pixel unit 43 disposed in the m+1th column and after is outputted through a second amplifier transistor (e.g., amplifier transistor AMI1) of the pixel unit arranged on the left side of the pixel unit 43, and a second output wiring (e.g., output wiring OUT1) of the adjacent pixel unit. That the imaging device 15*a* according to the embodiment 2 utilizes the second amplifier transistor and the second output wiring in the pixel unit positioned on the left side as a first amplifier transistor and a first output wiring of its own pixel unit.

Further, each pixel unit 43 according to the embodiment 3 has a floating diffusion switch RSW and a common state changeover switch FDSW in each row. In the pixel unit 43 according to the embodiment 3, when a floating diffusion switch RSW and a common state changeover switch FDSW arranged in each odd-numbered column are taken as a first floating diffusion switch RSW and a first common state changeover switch FDSW, a floating diffusion switch RSW and a common state changeover switch FSDW arranged in each even-numbered column respectively become a second floating diffusion switch RSW and a second common state changeover switch FDSW.

Since the coupling form of the floating diffusion switch RSW and the common state changeover switch FDSW arranged in each pixel unit 43 is substantially identical to that of the pixel unit 23 according to the embodiment 1, the description thereof will be omitted herein.

Subsequently, the operation of reading pixel data of the imaging device 15*a* according to the embodiment 3 will be described. The imaging device 15*a* according to the embodiment 3 is capable of changing the number of pixel units which generate pixel data to be read in one reading operation. While the number of pixel units capable of reading pixel data simultaneously can be changed even in the imaging device 15a according to the embodiment 3, the following description will be made about only a third example of reading pixel data generated by three pixel units in one reading operation.

Figure 15:
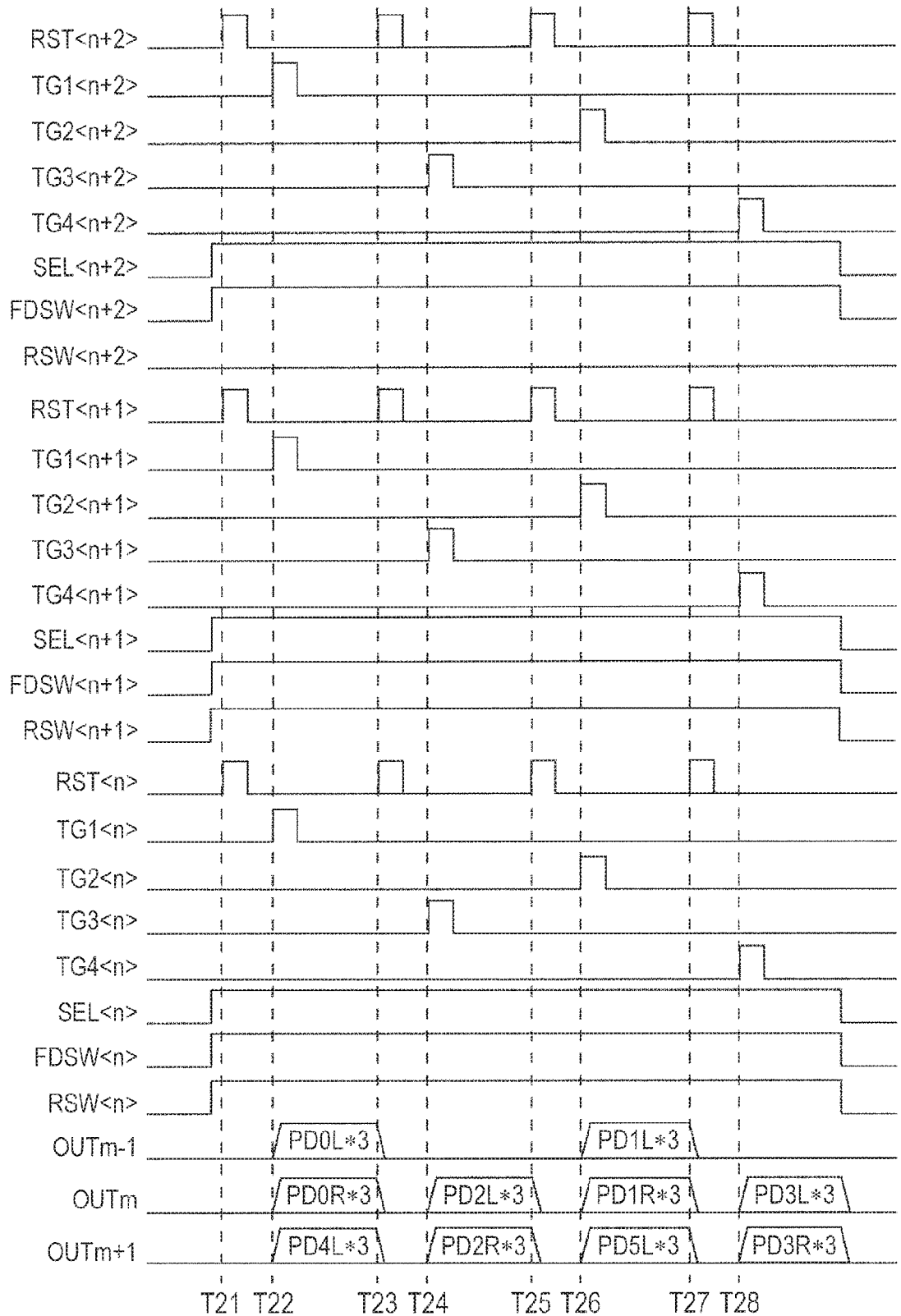
FIG. 15 is a timing chart showing operations where pixel signal corresponding to three rows are read at a time from a pixel array according to the embodiment 3.

A timing chart showing operations where pixel data corresponding to three rows are read from the pixel array according to the embodiment 3 is shown in FIG. 15. In the third example shown in FIG. 15, the row controller 40 according to the embodiment 3 switches row coupling state switch signals RSW and FD common state switch signals FDSW in an nth row and an n+1th row of rows to be read from a low level to a high level according to selection signals SEL. Further, the row controller switches even an FD common state switch signal FDSW in an n+2th row of the rows to be read from a low level to a high level according to a selection signal SEL. On the other hand, a row coupling state switch signal RSW in the n+2th row (uppermost row in the rows to be read) is maintained at a low level. Thus, in the pixel array according to the embodiment 3, floating diffusions FD of the pixel units in the nth to n+2th rows become a state of being coupled in parallel.

As shown in FIG. 15, even in the imaging device 15a according to the embodiment 3, the output from each photodiode to be read is performed during a period in which a selection sign SEL is high in level (timings T21 through T28). Further, even in the imaging device 15a according to the embodiment 3, a reset signal RST is placed in an enable state (e.g. high level) each time the photodiode to be read is switched (timings T21, T23, T25, and T27). Then, after the reset signal RST is brought into a disenable state (e.g., low level), a read timing signal corresponding to each photodiode to be read is placed in an enable state (timings T22, T24, T26, and T28) to thereby output an output signal from each photodiode. Incidentally, the order of the photodiodes to be read can be changed by changing the read timing signals TG1 through TG4.

Now, even in the imaging device 15a according to the embodiment 3 as shown in FIG. 15, the output from each diode pair formed below one microlens is simultaneously performed at one timing. Further, as shown in FIG. 15, when the pixel data is read from the pixel units corresponding to the three rows, various control signals given to each pixel unit arranged in each row not to be read are respectively maintained at a low level. Also, when the pixel data is read from the pixel units corresponding to the three rows, the electric charges generated within the pixel units to be read within pixel circuits are brought into a state of being combined by the floating diffusions FD brought into the parallel-coupled state. Further, the amplifier transistors within the pixel units to be read are also brought into a state of being coupled in parallel with respect to the output wirings. Therefore, when the pixel data is read from the pixel units corresponding to the three rows, the size of the pixel data becomes approximately three times larger when the pixel data is read from the pixel unit corresponding to one row.

From the above description the imaging device 15a using the pixel units 43 according to the embodiment 3 is capable of changing the number of pixel units to be read in one reading operation in a manner similar to the imaging device 15 according to the embodiment 1. Here, the imaging device 15a using the pixel units 43 according to the embodiment 3 has a configuration in which the amplifier transistor, the selection transistor, the reset transistor, and the output wiring are shared between each adjacent pixel unit. Therefore, the imaging device 15a according to the embodiment 3 is capable of reducing the number of transistors as compared with the imaging device 15 according to the embodiment 1. More specifically, when examining the number of other transistors relative to one photodiode pair, the pixel unit 23 according to the embodiment 1 includes 2.5 transistors, whereas the pixel unit 43 according to the embodiment 3 includes 1.5 transistors.

Embodiment 4

An embodiment 4 will describe pixel units 43a each configured as a form different from the pixel unit 43 according to the embodiment 3. To this end, a circuit diagram of the pixel units 43a according to the embodiment 4 is shown in FIG. 16.

Figure 16:
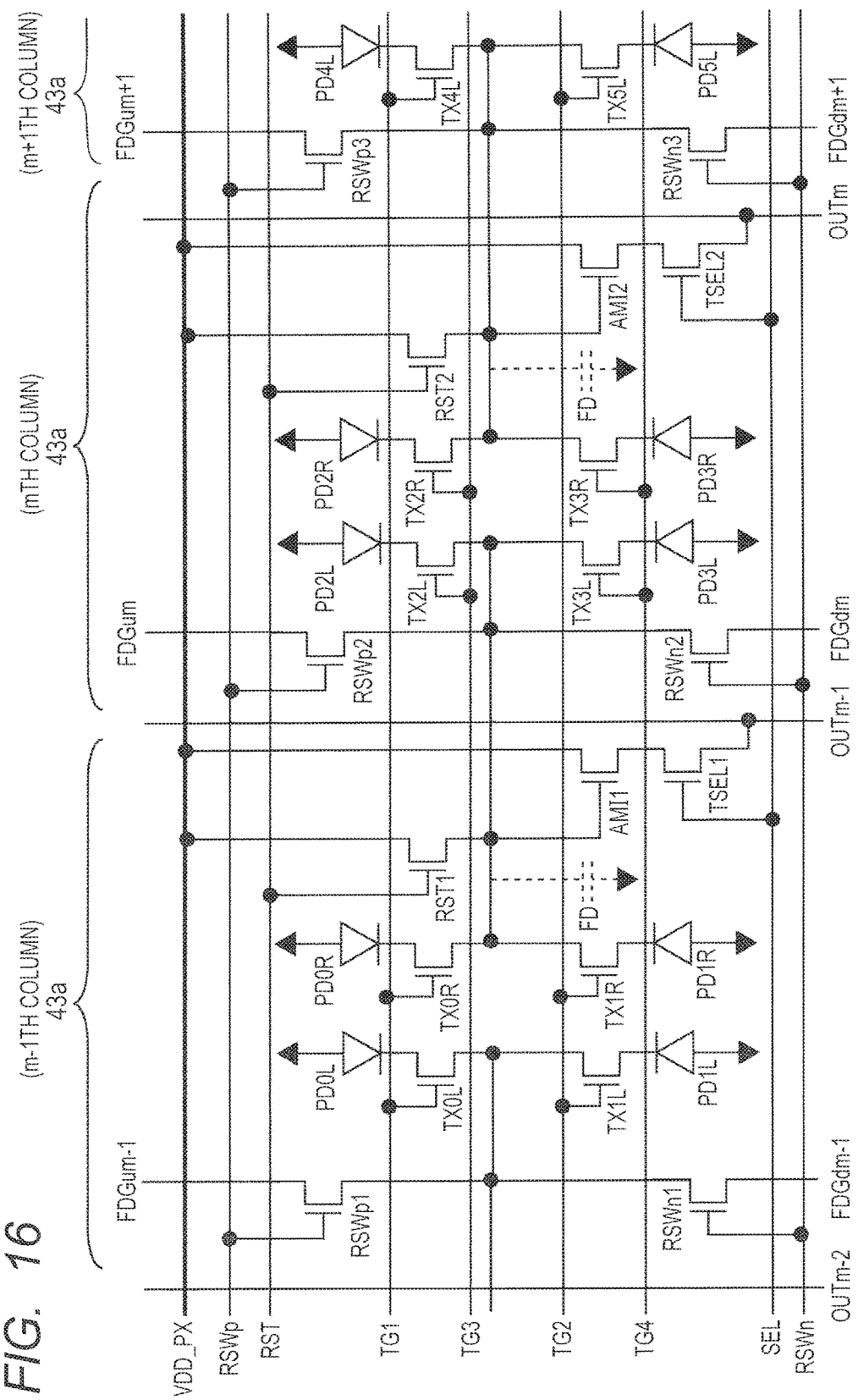
FIG. 16 is a circuit diagram of pixel units of an imaging device according to an embodiment 4.

As shown in FIG. 16, the pixel unit 43a according to the embodiment 4 has fist through fourth floating diffusion switches (e.g., floating diffusion switches RSWpA, RSWnA, RSWpB, and RSWnB) in place of the floating diffusion switches RSWA and RSWB and the common state changeover switches FDSWA and FDSWB of the pixel unit 43 according to the embodiment 3.

Here, since the coupling form of the floating diffusion switches RSWpA, RSWnA, RSWpB, and RSWnB is substantially identical to that of the pixel unit 23a according to the embodiment 2, the description thereof will be omitted herein.

Subsequently, the operation of reading pixel data of an imaging device according to the embodiment 4 will be described. The imaging device according to the embodiment 4 is capable of changing the number of pixel units which generate pixel data read in one reading operation. The following description will be made about only a third example of reading pixel data generated by three pixel units in one reading operation.

The operation of the row controller 40 in the imaging device according to the embodiment 4 will now be described. In the embodiment 4, the row controller 40 controls the floating diffusion switches RSWpA, RSWnA, RSWpB, and RSWnB in addition to control of the opening closing state of each element such as a transfer transistor. Specifically, the row controller 40 turns OFF the floating diffusion switches RSWpA and RSWpB which belong to the pixel unit positioned at the top of the pixel units which read electric charges simultaneously, and turns OFF the floating diffusion switches RSWnA and RSWnB which belong to the pixel unit positioned at the bottom of the pixel units which read electric charges simultaneously. Further, the row controller 40 turns ON a floating diffusion switch RSWpA and a floating diffusion switch RSWnA interposed by the floating diffusion switch RSWpA and the floating diffusion switch RSWrA both brought into the OFF state. The row controller 40 turns ON a floating diffusion switch RSWpB and a floating diffusion switch RSWnB interposed by the floating diffusion switch RSWpB and the floating diffusion switch RSWnB both brought into the OFF state.

Figure 17:
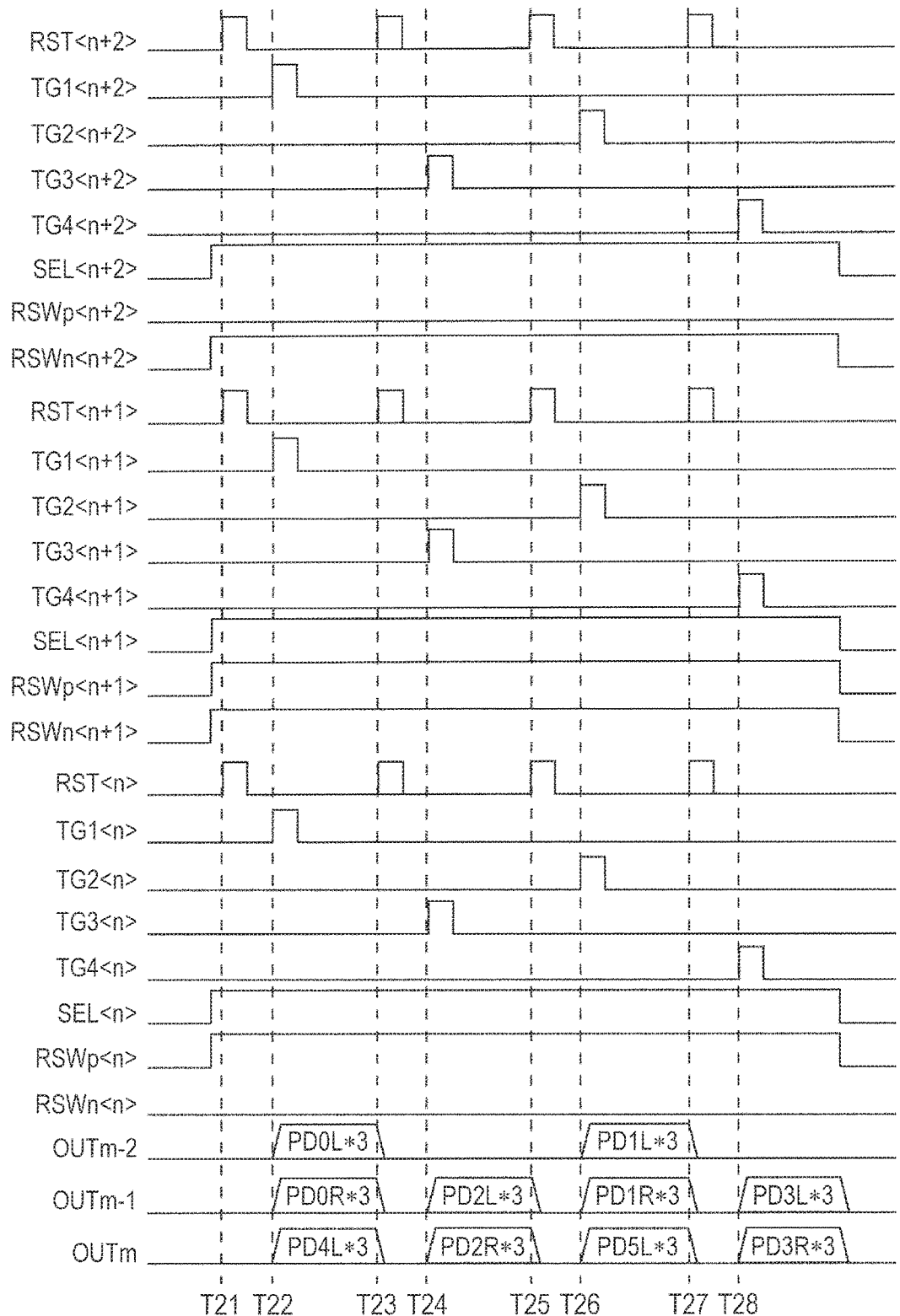
FIG. 17 is a timing chart showing operations where pixel signal corresponding to three rows are read at a time from a pixel array according to the embodiment 4.

Thus, a timing chart showing operations where pixel data corresponding to three rows are read from a pixel array according to the embodiment 4 is shown in FIG. 17. In the third example shown in FIG. 17, the row controller 40 according to the embodiment 4 maintains at a low level, a first row coupling state switch signal RSWp in an n±2th row as the top of rows to be read and a second row coupling state switch signal RSWn in an nth row as the bottom of the rows to be read. On the other hand, the row controller 40 according to the embodiment 4 switches a first row coupling state switch signal RSWp and a second row coupling state switch signal RSWn given to floating diffusion switches RSWpA, RSWnA, RSWpB, and RSWnB interposed by the floating diffusion switches RSWpA, RSWnA, RSWpB, and RSWnB respectively supplied with the row coupling state switch signals maintained at the low level, from a low level to a high level according to a selection signal SEL.

As shown in FIG. 17, even in the imaging device according to the embodiment 4, the output from each photodiode to be read is performed during a period in which the selection signal SEL is high in level (timings T21 through T28). Further, even in the imaging device according to the embodiment 4, a reset signal RST is placed in an enable state (e.g., high level) each time the photodiode to be read is switched (timings T21, T23, T25, and T27). Then, after the reset signal RST is brought into a disenable state (e.g., low level), a read timing signal corresponding to each photodiode to be read is placed in an enable state (timings T22, T24, T26, and T28) to thereby output an output signal from each photodiode. Incidentally, the order of the photodiodes to be read can be changed by changing the read timing signals TG1 through TG4.

Now, even in the imaging device according to the embodiment 4 as shown in FIG. 17, the output from a diode pair formed below one microlens is simultaneously performed at one timing. Further, as shown in FIG. 17, when the pixel data is read from the pixel units corresponding to the three rows, various control signals given to each pixel unit arranged in each row not to be read are respectively maintained at a low level. Also, when the pixel data is read from the pixel units corresponding to the three rows, the electric charges generated within the pixel units to be read within pixel circuits are brought into a state of being combined by floating diffusions FD brought into a parallel-coupled state. Further, amplifier transistors within the pixel units to be read are also brought into a state or being coupled in parallel with respect to output wirings. Therefore, when the pixel data is read from the pixel units corresponding to the three rows, the size of the pixel data becomes approximately three times larger when the pixel data is read from the pixel unit corresponding to one row.

From the above description, even in each pixel unit 43a according to the embodiment 4, the combining of the pixel data is performed within the pixel units in a manner similar to the pixel unit 23 according to the embodiment 1, and thereby the SN ratio of the pixel data can be enhanced.

Incidentally, in the pixel unit 43a according to the embodiment 4, the number or the transistors coupled to the floating diffusion becomes larger by one than the pixel unit 43 according to the embodiment 3. Therefore, when the parasitic capacity of each floating diffusion is increased, the pixel unit 43a according to the embodiment 4 is ore advantageous than the pixel unit 43 according to the embodiment 3.

Embodiment 5

Figure 18:
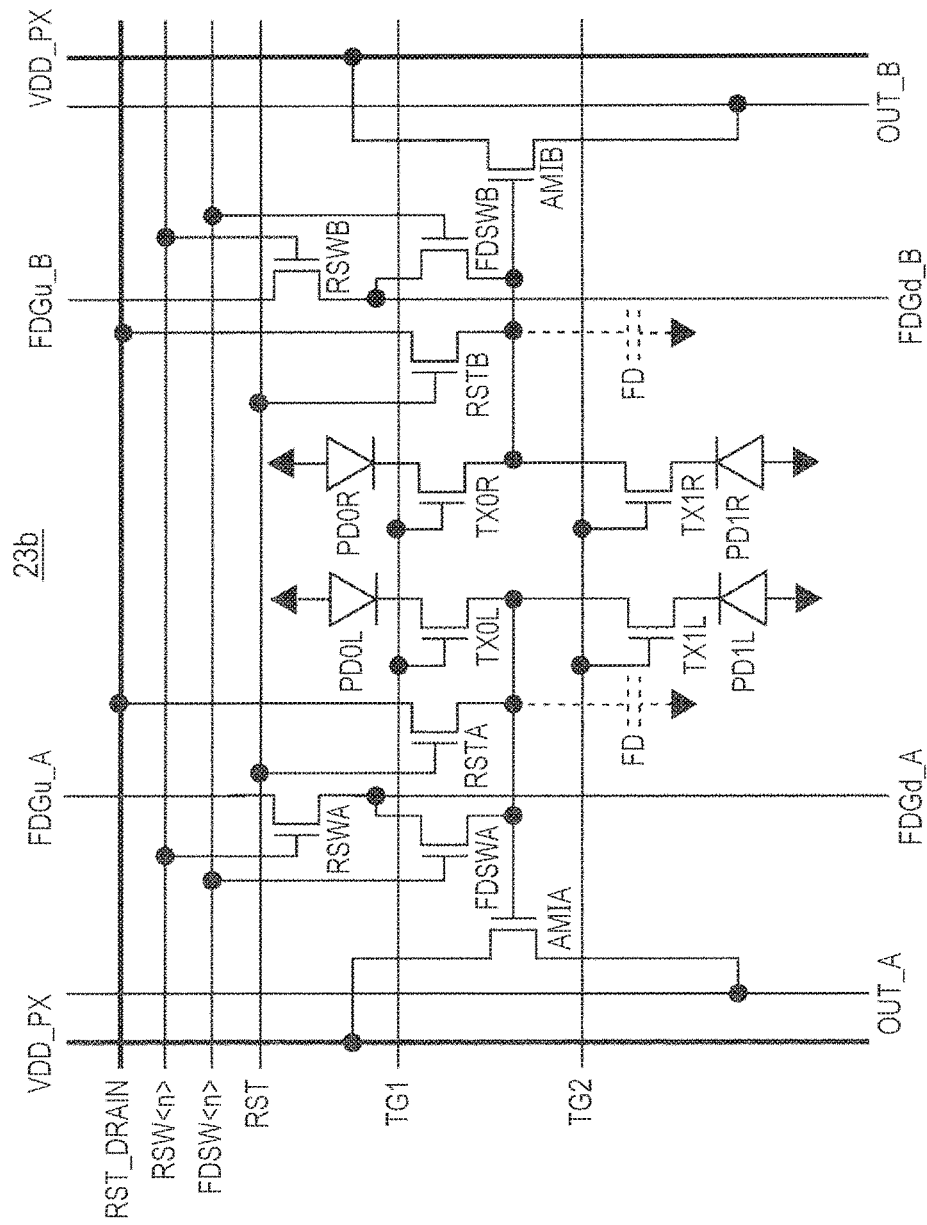
FIG. 18 is a circuit diagram of a pixel unit of an imaging device according to an embodiment 5.

An embodiment 5 will describe another form of the pixel unit 23 according to the embodiment 1. To this end, a circuit diagram of a pixel unit 23b according to the embodiment 5 is shown in FIG. 18. As shown in FIG. 18, the pixel unit 23b according to the embodiment 5 is one in which the selection transistors TSELA, TSELB, TSELA, and TSELB are deleted from the pixel unit 23 according to the embodiment 1, and the sources of the amplifier transistors are directly coupled to their corresponding output wirings. Further, as shown in FIG. 18, in the pixel unit 23b according to the embodiment 5, a drain reset wiring RST_DRAIN is coupled to drains of reset transistors RSTA, RSTB, RSTA, and RSTB. A drain reset signal brought into an enable state (e.g., high level) during a period in which the pixel unit 23b is activated is transmitted to the drain reset wiring RST_DRAIN.

Figure 19:
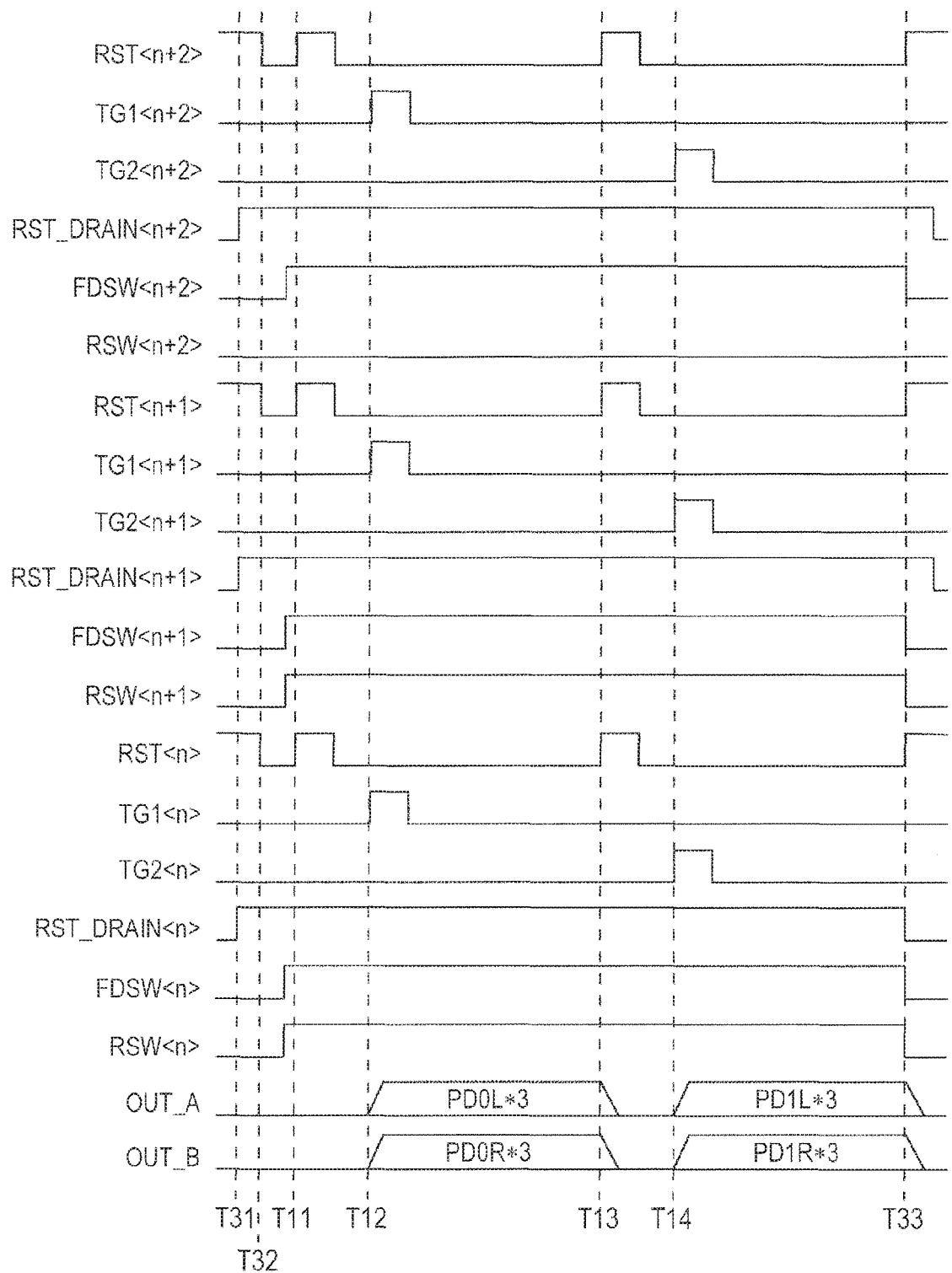
FIG. 19 is a timing chart showing operations where pixel signal corresponding to three rows are read at a time from a pixel array according to the embodiment 5.

Subsequently, the operation of the pixel unit 23b according to the embodiment will be described. To this end, a timing chart showing operations where pixel data corresponding to three rows are read at a time from a pixel array according to the embodiment 5 is shown in FIG. 19. In the following description, only parts different in operation from the pixel unit 23 according to the embodiment 1 will be described.

In an imaging device according to the embodiment 5 as shown in FIG. 19, during a period other than a row selection period in which each row to which its own pixel unit belongs is activated, a drain reset signal RST_DRAIN is placed in a disenable state (e.g., low level or ground voltage level), and a reset signal RST is placed in an enable state (e.g., high level or power supply voltage). Thus, since a low level voltage is applied to the gate of each amplifier transistor of the pixel unit 23b.

On the other hand, in the imaging device according to the embodiment 5, during the row selection period in which each row to which the own pixel unit belongs is activated, the drain reset signal RST_DRAIN is placed in an enable state(e.g., high level or power supply voltage level), and the reset signal RST is placed in an enable state (e.g., high level or power supply voltage level) according to a reset timing timings T11 and T13). Thus, in the imaging device according to the embodiment 5, each floating diffusion FD is reset according to the reset signal RST. Further, in the imaging device according to the embodiment 5, output signals from photodiodes are outputted to their corresponding output wirings according to the fact that a first read timing signal TG1 and a second read timing signal TG2 are respectively placed in an enable state (timings T12 and T14). As shown in FIG. 19, in the imaging device according to the embodiment 5, the output signals of the two photodiodes which configure a photodiode pair are respectively outputted at the same timing in a manner similar to the imaging device 15 according to the embodiment 1.

From the above description, even in the pixel unit 23b according to the embodiment 5, the combining of the pixel data is performed within the pixel units in a manner similar to the pixel unit 23 according to the embodiment 1, and thereby the SN ratio of the pixel data can be enhanced. In the imaging device having the pixel unit 23b according to the embodiment 5, the number of transistors can be reduced by deleting the selection transistors as compared with the imaging device 15 according to the embodiment 1.

Embodiment 6

Figure 20:
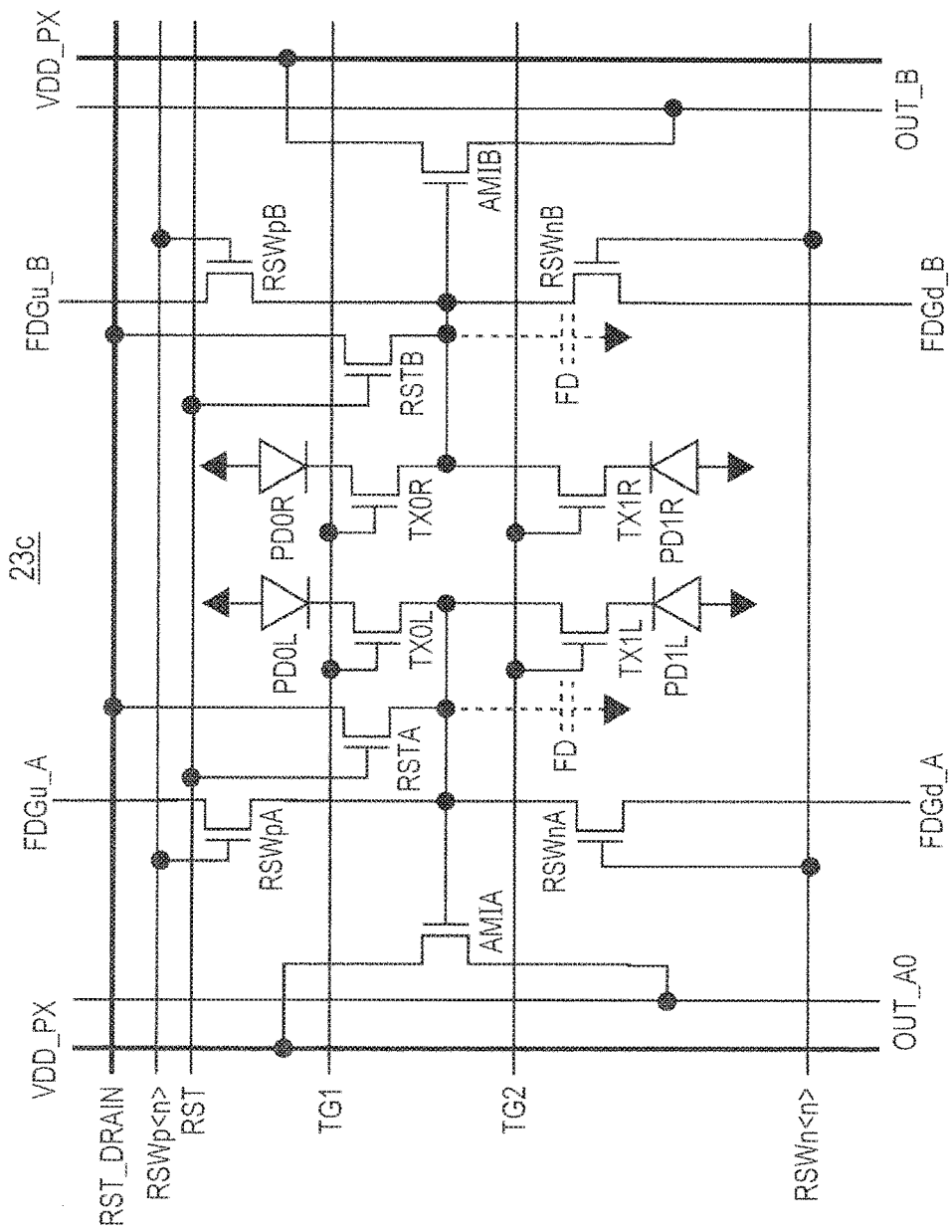
FIG. 20 is a circuit diagram of a pixel unit of an imaging device according to an embodiment 6.

An embodiment 6 will describe another form of the pixel unit 23a according to the embodiment 2. To this end, a circuit diagram of a pixel unit 23c according to the embodiment 6 is shown in FIG. 20. As shown in FIG. 20, the pixel unit 23c according to the embodiment 6 is one in which the selection transistors TSELA and TSELB are deleted from the pixel unit 23a according to the embodiment 2, and the sources of the amplifier transistors are directly coupled to their corresponding output wirings. Further, as shown in FIG. 20, in the pixel unit 23c according to the embodiment 6, a drain reset wiring RST_DRAIN is coupled to drains of reset transistors RSTA, RSTB, RSTA, and RSTB. A drain reset signal brought into an enable state (e.g., high level) during a period in which the pixel unit 23c is activated is transmitted to the drain reset wiring RST DRAIN.

In terms of the operation of the pixel unit 23c according to the embodiment 6, a part which performs a reset operation of the pixel unit 23a according to the embodiment 2 in a manner similar to the pixel unit 23b according to the embodiment 5 is different only in operation from the pixel unit 23a according to the embodiment 2. Its detailed description will therefore be omitted herein.

From the above description, even in the pixel unit 23c according to the embodiment 6, the combining of pixel data is performed within the pixel units in a manner similar to the pixel unit 23 according to the embodiment 1, and thereby the SN ratio of the pixel data can be enhanced. In an imaging device having the pixel unit 23c according to embodiment 6, the number of transistors can be reduced by deleting the selection transistors as compared with the imaging device 15 according to the embodiment 2.

Embodiment 7

Figure 21:
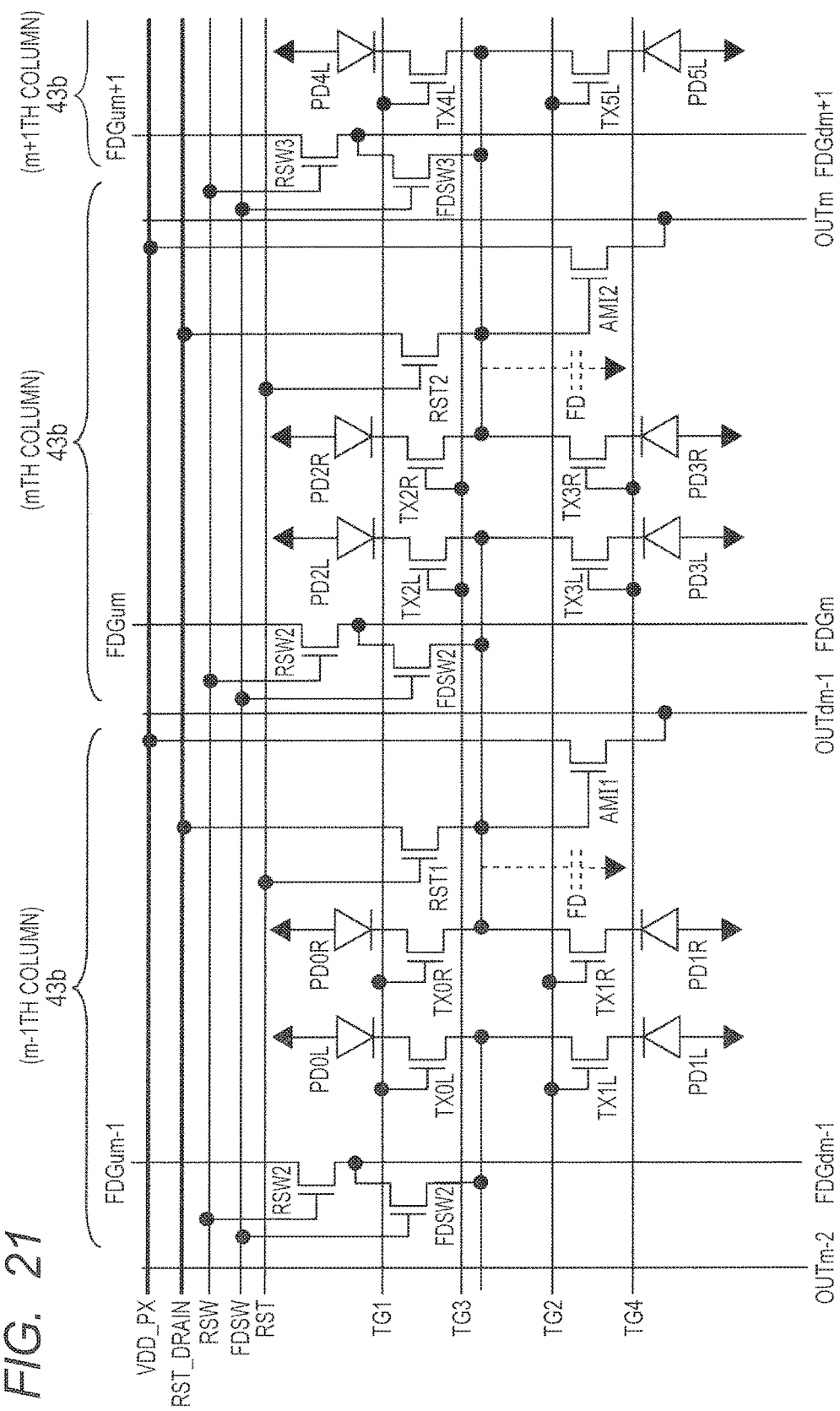
FIG. 21 is a circuit diagram of pixel units of an imaging device according to an embodiment 7.

An embodiment 7 will describe another form of the pixel unit 43 according to the embodiment 3. To this end, a circuit diagram of pixel units 43b according to the embodiment 7 is shown in FIG. 21. As shown in FIG. 21, the pixel units 43b according to the embodiment 7 are those in which the selection transistors TSELA, TSELB are deleted from the pixel units 43 according to the embodiment 3, and the sources of the amplifier transistors are directly coupled to their corresponding output wirings. Further, as shown in FIG. 21, in each pixel unit 43b according to the embodiment 7, a drain reset wiring RST_DRAIN is coupled to drains of reset transistors RSTA, RSTB, RSTA, and RSTB. A drain reset signal brought into an enable state (e.g., high level) during a period in which the pixel unit 43b is activated is transmitted to the drain reset wiring RST_DRAIN.

In terms of the operation of the pixel unit 43b according to the embodiment 7, a part which performs a reset operation of the pixel unit 43 according to the embodiment 3 in a manner similar to the pixel unit 23b according to the embodiment 5 is different only in operation from the pixel unit 43 according to the embodiment 3. Its detailed description will therefore be omitted herein.

From the above description, even in each pixel unit 43b according to the embodiment 7, the combining of pixel data is performed within the pixel units in a manner similar to the pixel unit 23 according to the embodiment 1, and thereby the SN ratio of the pixel data can be enhanced. In an imaging device having the pixel units 43b according to the embodiment 7, the number of transistors can be reduced by deleting the selection transistors as compared with the imaging device 15a according to the embodiment 3.

Embodiment 8

Figure 22:
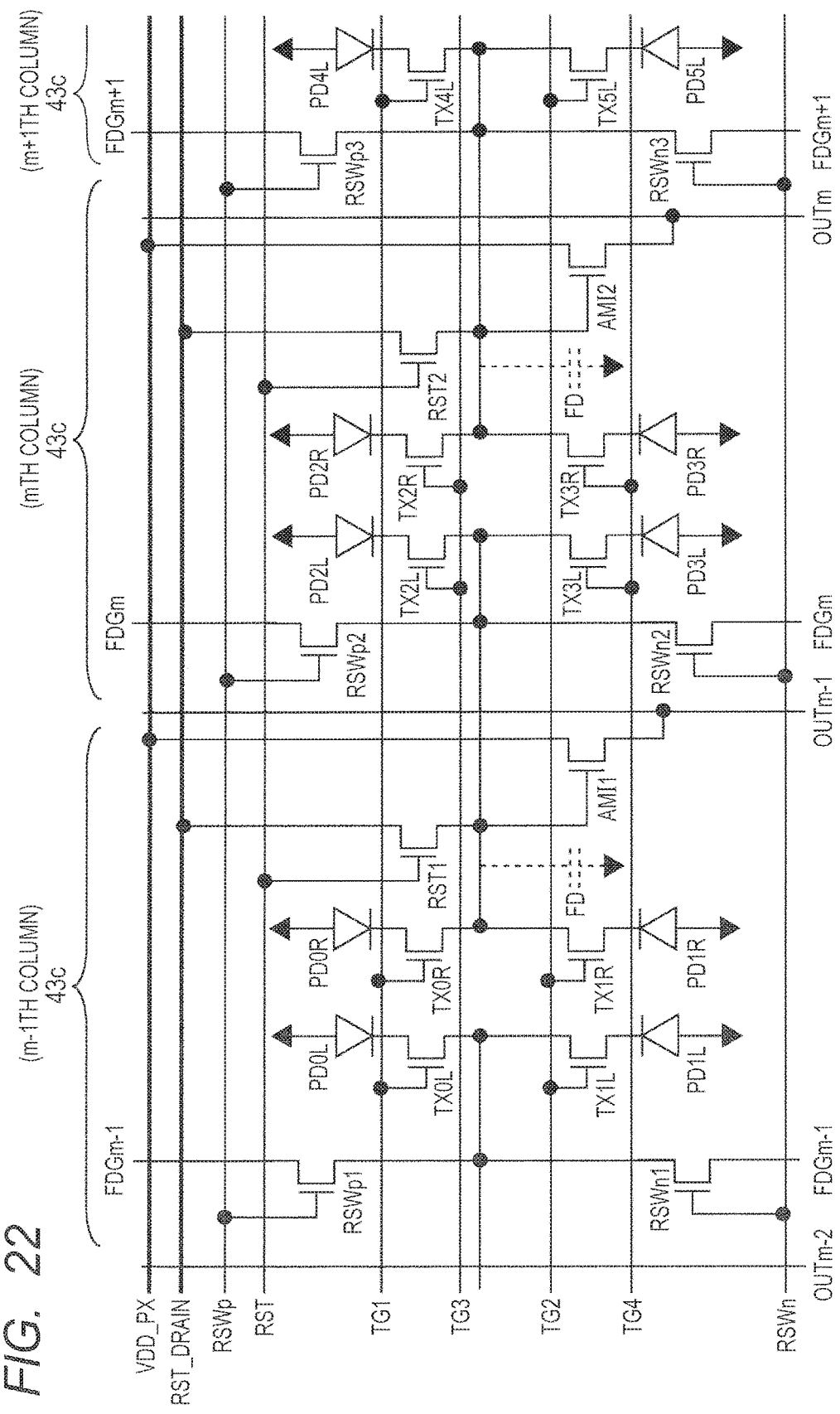
FIG. 22 is a circuit diagram of pixel units of an imaging device according to an embodiment 8.

An embodiment 8 will describe another form of the pixel unit 43a according to the embodiment 4. To this end, a circuit diagram of pixel units 43c according to the embodiment 8 is shown in FIG. 22. As shown in FIG. 22, the pixel unit 43c according to the embodiment 8 is one in which the selection transistors TSELA, TSELB, TSELA, and TSELB are deleted from the pixel unit 43a according to the embodiment 4, and the sources of the amplifier transistors are directly coupled to their corresponding output wirings. Further, as shown in FIG. 22, in the pixel unit 43c according to the embodiment 8, a drain reset wiring RST_DRAIN is coupled to drains of reset transistors RSTA, RSTB. A drain reset signal brought into an enable state (e.g., high level) during a period in which the pixel unit 43c is activated is transmitted to the drain reset wiring RST_DRAIN.

In terms of the operation of the pixel unit 43c according to the embodiment 8, a part which performs a reset operation of the pixel unit 43a according to the embodiment 4 in a manner similar to the pixel unit 23b according to the embodiment 5 is different only in operation from the pixel unit 43a according to the embodiment 4. Its detailed description will therefore be omitted herein.

From the above description, even in each pixel unit 43c according to the embodiment 8, the combining of pixel data is performed within the pixel units in a manner similar to the pixel unit 23 according to the embodiment 1, and thereby the SN ratio of the pixel data can be enhanced. In an imaging device having the pixel units 43c according to the embodiment 8, the number of transistors can be reduced by deleting the selection transistors as compared with the imaging device 15a according to the embodiment 4.

Embodiment 9

An embodiment 9 will describe a processing method of pixel data read from the pixel units described in the embodiments 1 through 8. The pixel units described in the embodiments 1 through 8 are respectively capable of individually reading pixel data from a pair of photodiodes provided below on microlens. Image data can be generated by combining the pixel data individually read from the pair of photodiodes. Further, difference data between the pixel data individually read from the pair of photodiodes can be utilized as phase difference data in autofocus control.

Thus, the focus in the camera system 1 will first be described. To this end, a diagram describing the principle of a phase difference autofocus in the imaging device is shown In FIG. 23. FIG. 23 shows a positional relation between an evaluation surface (e.g., image surface) formed in the surface of the imaging device and a focusing surface on which images of light incident from the focus lens are focused.

When focus coincidence is taken as shown in FIG. 23, the focusing surface on which the images of light incident from the focus lens are focused coincides with the image surface (top diagram in FIG. 23). On the other hand, when the focus is deviated, the focusing surface on which the images of light incident from the focus lens are focused is formed at a position different from the image surface (bottom diagram in FIG. 23). An amount of deviation between the focusing surface and the image surface becomes a defocus amount.

Figure 24:
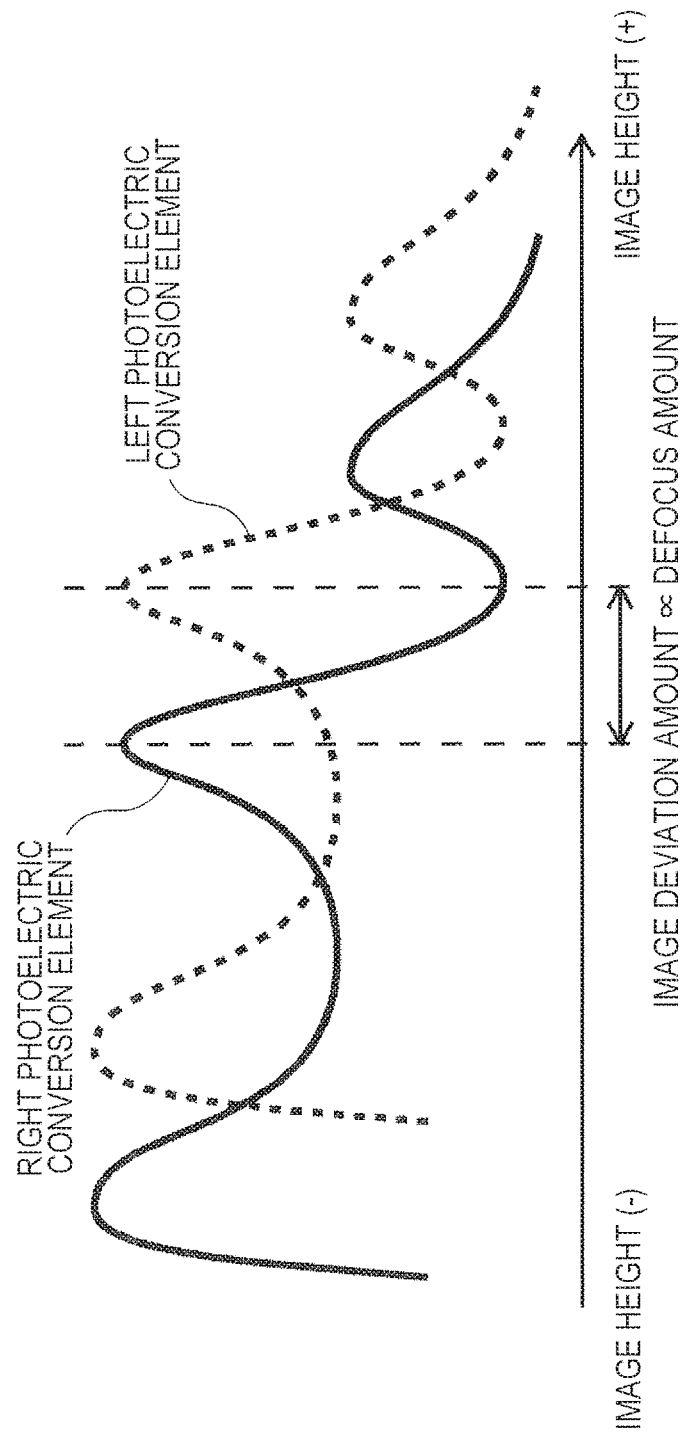
FIG. 24 is a graph describing the output of a photoelectric conversion element where a focus deviation occurs.

A description will now be made about images formed on the image surface where the focus is deviated. To this end, a graph describing the output of each photoelectric conversion element where the focus is deviated is shown in FIG. 24. In FIG. 24, an image height indicative of the distance of the photoelectric conversion element from the central axis of the lens is shown on the horizontal axis, and the magnitude of the output of the photoelectric conversion element is shown on the vertical axis.

As shown in FIG. 24, when the focus is deviated, a signal outputted from the left photoelectric conversion element and a signal outputted from the right photoelectric conversion element are deviated in an image height direction. This amount of image deviation is proportional in magnitude to the defocus amount. Therefore, the camera system 1 calculates the defocus amount, based on the amount of image deviation to determine the position of the focus lens 14.

The autofocus processing of the camera system 1 controls the position of the focus lens 14 in such a manner that the output signals outputted from all the pixel units arranged in the pixel array 22 of the imaging device 15 coincide with each other between the left photoelectric conversion element and the right photoelectric conversion element. Further, in the camera system 1, the system control MCU 19 performs control on the position of the focus lens 14, based on revolution data outputted from the imaging device 15.

Subsequently, a description will be made about a system configuration of the camera system 1 which generates image data by synthetic processing of pixel data and generates phase difference data (AF data) used in the auto focus. To this end, a diagram describing a configuration example of the camera system 1 according to the embodiment 9 is shown in FIG. 25. Incidentally, in the following description, in order to describe a difference in system configuration, an example of reading pixel data at different timings from a pair of photodiodes formed below one microlens shown in, for example, Patent Document 1 will be described as a comparative example.

In the system configuration according to the comparative example, as shown in FIG. 25, pixel data of left and right pixels are outputted at different timings. Therefore, for example, the pixel data of each right pixel firstly outputted within a signal processing circuit such as an ISP or the like is required to be held using a memory unit such as an SRAM. Further, in the system configuration according to the comparative example, addition processing and difference processing are performed using the pixel data of each right pixel held in the SRAM, and the pixel data of each left pixel outputted from the pixel with being delayed from the right pixel. The pixel data of the right and left pixels are combined together by the addition processing to generate image data. Further, in the difference processing, the difference between the pixel data of the right and left pixels is calculated to generate AF data.

On the other hand, in the system configuration according to the embodiment 9, an addition processing unit and a difference processing unit are provided within the imaging device. The addition processing unit adds first pixel data (e.g., left pixel data) and second pixel data (e.g., right pixel data) outputted at the same output timing through the first output wiring OUT_A and the second output wiring OUT_B to generate pixel data. The Difference processing unit outputs as phase difference data (e g. AF data), a difference between the first pixel data (e.g., left pixel data) and the second pixel data (e.g., right pixel data) outputted at the same output timing through the first output wiring OUT_A and the second output wiring OUT_B.

Subsequently, a description will be made about processing timings of pixel data in the camera system 1 according the embodiment 9. To this end, a diagram describing the processing timings of the pixel data in the camera system according to the embodiment 9 is illustrated in FIG. 26.

Figure 26:
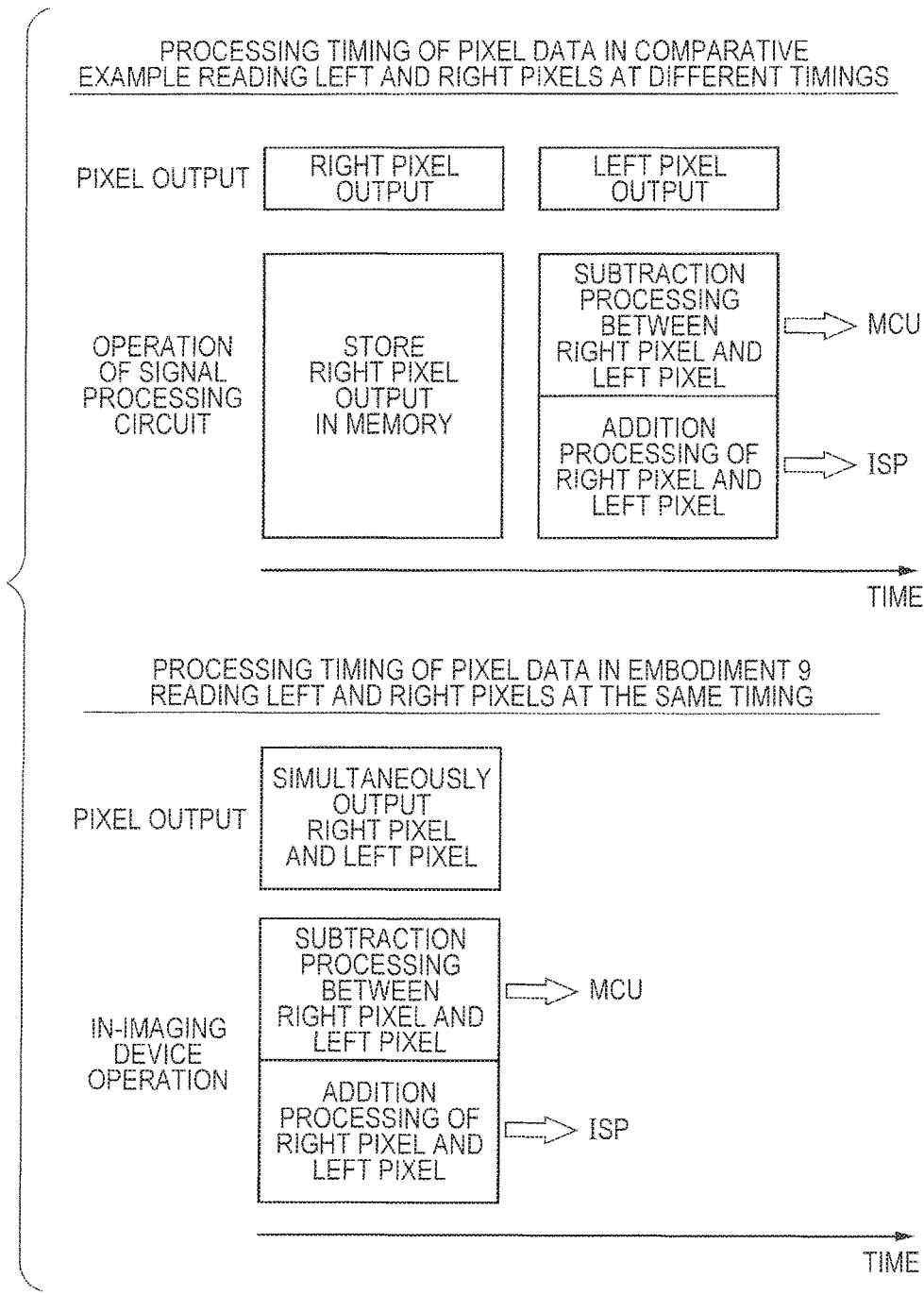
FIG. 26 is a diagram describing processing timings in the camera system according to the embodiment 9.

As shown in FIG. 26, in the processing timings of the pixel data in the comparative example, the difference processing and the addition processing must be done in wait for the left pixel data outputted subsequently. On the other hand, in the camera system according to the embodiment 9, the right and left pixels are outputted at one timing. Therefore, in the camera system 1 according to the embodiment 9, the output, addition processing, and difference processing of pixel data from pixels are completed at one timing.

From the above description, the AF data and the image data can be generated within the imaging device by utilizing the pixel units described in the embodiments 1 through 8. Further, the time required to generate each of the AF data and the image data can be shortened by utilizing the pixel units described in the embodiments 1 through 8.

Although the invention made above by the present inventors has been described specifically on the basis of the preferred embodiments, the present invention is not limited to the embodiments already referred to above. It is needless to say that various changes can be made thereto within the scope not departing from the gist thereof.

What is claimed is:
1. An imaging device comprising a plurality of pixel units arranged in a lattice form, the pixel units respectively comprising:
  a first photoelectric conversion element;
  a second photoelectric conversion element which is adjacent to the first photoelectric conversion element and receives light incident through a microlens provided in common with the first photoelectric conversion element;
  a first transfer transistor which reads electric charges from the first photoelectric conversion element;
  a second transfer transistor which reads electric charges from the second photoelectric conversion element;
  a first read timing signal wiring which provides a first read timing signal common to the first transfer transistor and the second transfer transistor;
  a first floating diffusion which stores the electric charges read through the first transfer transistor;
  a second floating diffusion which stores the electric charges read through the second transfer transistor;
  a first common floating diffusion wiring provided in common with respect to the pixel units adjacent in a column direction, of the pixel units;
  a first floating diffusion switch which is arranged over the first common floating diffusion wiring and switches whether or not to electrically couple between the pixel units;
  a first common state changeover switch which switches an electrical coupling state between the first floating diffusion and the first common floating diffusion wiring;
  a second common floating diffusion wiring provided in common with respect to the pixel units adjacent in the column direction, of the pixel units;
  a second floating diffusion switch which is arranged over the first common floating diffusion wiring and switches whether or not to electrically couple between the pixel units;
  a second common state changeover switch which switches an electrical coupling state between the second floating diffusion and the second common floating diffusion wiring;
  a first output wiring which outputs an output signal generated based on the electric charges stored in the first floating diffusion; and
  a second output wiring which outputs an output signal generated based on the electric charges stored in the second floating diffusion.

2. The imaging device according to claim 1,
  wherein color filters are provided below the microlenses provided in the pixel units, and
  wherein the first common floating diffusion wiring and the second common floating diffusion wiring couple between the pixel units which are different from each other and in which the color filters formed below the microlenses are the same color.

3. The imaging device according to claim 2, wherein the color filters are arranged in a Bayer system.

4. The imaging device according to claim 1, comprising a row controller which controls the first floating diffusion switch, the second floating diffusion switch, the first common state changeover switch, and the second common state changeover switch, wherein the row controller determines the number of the first and second floating diffusion switches turned ON continuously over the first common floating diffusion wiring and the second common floating diffusion wiring according to the number of the pixel units which read the electric charges simultaneously, and wherein the row controller turns ON the first common state changeover switch and the second common state changeover switch within each of the pixel units which read the electric charges simultaneously.

5. The imaging device according to claim 1, comprising:

a first amplifier transistor which amplifies a first voltage generated by the electric charges outputted through the first transfer transistor and outputs the same to the first output wiring; and a second amplifier transistor which amplifies a second voltage generated by the electric charges outputted through the second transfer transistor and outputs the same to the second output wiring.

6. The imaging device according to claim 5, comprising:

a third photoelectric conversion element;

a fourth photoelectric conversion element which is adjacent to the third photoelectric conversion element and receives light incident through a microlens provided in common with the third photoelectric conversion element;

a third transfer transistor which reads electric charges from the third photoelectric conversion element and outputs a third voltage generated by the read electric charges to the first amplifier transistor;

a fourth transfer transistor which reads electric charges from the fourth photoelectric conversion element and outputs a fourth voltage generated by the read electric charges to the second amplifier transistor; and a second read timing signal wiring which is made common to the third transfer transistor and the fourth transfer transistor and provides a second read timing signal brought into an enable state at a timing different from the first read timing signal.

7. The imaging device according to claim 5, comprising:

a fifth photoelectric conversion element;

a sixth photoelectric conversion element which is adjacent to the fifth photoelectric conversion element and receives light incident through a microlens provided in common with the fifth photoelectric conversion element;

a fifth transfer transistor which reads electric charges from the fifth photoelectric conversion element and outputs a fifth voltage generated by the read electric charges to the second amplifier transistor;

a sixth transfer transistor which reads electric charges from the sixth photoelectric conversion element; and a third read timing signal wiring which is made common to the fifth transfer transistor and the sixth transfer transistor and provides a third read timing signal brought into an enable state at a timing different from the first read timing signal, wherein the fifth voltage generated by the electric charges outputted through the fifth transfer transistor is amplified by the second amplifier transistor and outputted to the second output wiring.

8. The imaging device according to claim 5, comprising:

a first selection transistor provided between the first amplifier transistor and the first output wiring;

a second selection transistor provided between the second amplifier transistor and the second output wiring; and a selection signal wiring which provides a selection signal common to the first selection transistor and the second selection transistor.

9. The imaging device according to claim 5, comprising:

a first reset transistor having a drain electrically coupled to a gate of the first amplifier transistor, and a source to which a reset voltage is applied;

a second reset transistor having a drain electrically coupled to a gate of the second amplifier transistor, and a source to which the reset voltage is applied; and a reset signal wiring which provides a reset signal common to the first reset transistor and the second reset transistor.

10. An imaging device comprising a plurality of pixel units arranged in a lattice form, the pixel units respectively comprising:

a first. photoelectric conversion element;

a second photoelectric conversion element which is adjacent to the first photoelectric conversion element and receives light incident through a microlens provided in common with the first photoelectric conversion element;

a first transfer transistor which reads electric charges from the first photoelectric conversion element;

a second transfer transistor which reads electric charges from the second photoelectric conversion element;

a first floating diffusion which stores the electric charges read through the first transfer transistor;

a second floating diffusion which stores the electric charges read through the second transfer transistor;

a first common floating diffusion wiring provided in common with respect to the upper-order adjacent pixel units adjacent in an upper-order direction as viewed in a column direction;

a first floating diffusion switch which couples the first common floating diffusion wiring and the first floating diffusion;

a second common floating diffusion wiring provided in common with respect to the lower-order adjacent pixel units adjacent in a lower-order direction as viewed in the column direction;

a second floating diffusion switch which couples the second common floating diffusion wiring and the first floating diffusion;

a third common floating diffusion wiring provided in common with respect to the upper-order adjacent pixel units adjacent in the upper-order direction as viewed in the column direction;

a third floating diffusion switch which couples the third common floating diffusion wiring and the second floating diffusion;

a fourth common floating diffusion wiring provided in common with respect to the lower-order adjacent pixel units adjacent in the lower-order direction as viewed in the column direction;

a fourth floating diffusion switch which couples the fourth common floating diffusion wiring and the second floating diffusion;

a first read timing signal wiring which provides a first read timing signal common to the first transfer transistor and the second transfer transistor;

a first output wiring which outputs an output signal generated based on the electric charges stored in the first floating diffusion; and a second output wiring which outputs an output signal generated based on the electric charges stored in the second floating diffusion.

11. The imaging device according to claim 10,
wherein color filters are provided below the microlenses provided in the pixel units, and
wherein the first through fourth floating diffusion wirings couple between the pixel units which are different from each other and in which the color filters formed below the microlenses are the same color.

12. The imaging device according to claim 11, wherein the color filters are arranged in a Bayer system.

13. The imaging device according to claim 10, comprising a row controller which controls the first through fourth floating diffusion switches,
wherein the row controller turns OFF the first floating diffusion switch and the third floating diffusion switch which belong to the pixel unit positioned at the top of the pixel units which read the electric charges simultaneously,
turns OF the second floating diffusion switch and the fourth floating diffusion switch which belong to the pixel unit positioned as bottom of the pixel units which read the electric charges simultaneously,
turns ON the first floating diffusion switch and the second floating diffusion switch interposed by the first and second floating diffusion switches brought into the OFF state, and
turns ON the third floating diffusion switch and the fourth floating diffusion switch interposed by the third and fourth floating (diffusion switches brought into the OFF state.

14. The imaging device according to claim 10, comprising:
an addition processing unit which adds first pixel data and second pixel data outputted at the same output timing through the first output wiring and the second output wiring to generate pixel data; and
a difference processing unit which outputs as phase difference data, a difference between the first pixel data and the second pixel data outputted at the same output timing through the first output wiring and the second output wiring.

15. An imaging device comprising a plurality of pixel units arranged in a lattice form, comprising:
the pixel units;
an addition processing unit; and
a difference processing unit,
wherein the pixel units respectively comprise:
a first photoelectric conversion element;
a second photoelectric conversion element which is adjacent to the first photoelectric conversion element and receives light incident through a microlens provided in common with the first photoelectric conversion element;
a first transfer transistor which reads electric charges from the first photoelectric conversion element;
a second transfer transistor which reads electric charges from the second photoelectric conversion element;
a first floating diffusion which stores the electric charges read through the first transfer transistor;
a second floating diffusion which stores the electric charges read through the second transfer transistor;
a first common floating diffusion wiring provided in common with respect to the pixel units adjacent in a column direction, of the pixel units;
a first floating diffusion switch which is arranged over the first common floating diffusion wiring and switches whether or not to electrically couple between the pixel units;
a first common state changeover switch which switches an electrical coupling state between the first floating diffusion and the first common floating diffusion wiring;
a second common floating diffusion wiring provided in common with respect to the pixel units adjacent in the column direction, of the pixel units;
a second floating diffusion switch which is arranged over the first common floating diffusion wiring and switches whether or not to electrically couple between the pixel units;
a second common state changeover switch which switches an electrical coupling state between the second floating diffusion and the second common floating diffusion wiring;
a first read timing signal wiring which provides a first read timing signal common to the first transfer transistor and the second transfer transistor;
a first output wiring which outputs an output signal generated based on the electric charges stored in the first floating diffusion; and
a second output wiring which outputs an output signal generated based on the electric charges stored in the second floating diffusion,
wherein the addition processing unit adds first pixel data and second pixel data outputted at the same output timing through the first output wiring and the second output wiring to generate pixel data, and
wherein the difference processing unit outputs as phase difference data, a difference between the first pixel data and the second pixel data outputted at the same output timing through the first output wiring and the second output wiring.

* * * * *